United States Patent
Takeda et al.

(10) Patent No.: US 11,041,237 B2
(45) Date of Patent: Jun. 22, 2021

(54) VAPOR DEPOSITION MASK, VAPOR DEPOSITION MASK PREPARATION BODY, METHOD FOR PRODUCING VAPOR DEPOSITION MASK, AND METHOD FOR PRODUCING ORGANIC SEMICONDUCTOR ELEMENT

(71) Applicant: Dai Nippon Printing Co., Ltd., Tokyo (JP)

(72) Inventors: Toshihiko Takeda, Tokyo (JP); Katsunari Obata, Tokyo (JP); Hiromitsu Ochiai, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 15/898,682

(22) Filed: Feb. 19, 2018

(65) Prior Publication Data

US 2018/0171470 A1 Jun. 21, 2018

Related U.S. Application Data

(63) Continuation of application No. 14/783,736, filed as application No. PCT/JP2014/058049 on Mar. 24, 2014, now abandoned.

(30) Foreign Application Priority Data

| Apr. 12, 2013 | (JP) | ................................. | 2013-084276 |
| Apr. 12, 2013 | (JP) | ................................. | 2013-084277 |
| Mar. 24, 2014 | (JP) | ................................. | 2014-059431 |

(51) Int. Cl.
*C23C 16/04* (2006.01)
*H01L 27/32* (2006.01)
(Continued)

(52) U.S. Cl.
CPC .......... *C23C 16/042* (2013.01); *B05C 21/005* (2013.01); *B23K 26/0604* (2013.01);
(Continued)

(58) Field of Classification Search
None
See application file for complete search history.

(56) References Cited

U.S. PATENT DOCUMENTS

| 4,857,383 A | 8/1989 | Greschner |
| 2005/0123676 A1 | 6/2005 | Kuwahara et al. |

(Continued)

FOREIGN PATENT DOCUMENTS

| CN | 1620203 A | 5/2005 |
| CN | 101220452 | 7/2008 |

(Continued)

OTHER PUBLICATIONS

Japanese Office Action (Application No. 2018-079995) dated Jan. 16, 2019 (with English translation).
(Continued)

*Primary Examiner* — Jethro M. Pence
(74) *Attorney, Agent, or Firm* — Burr & Brown, PLLC

(57) ABSTRACT

There are provided a vapor deposition mask capable of satisfying both high definition and lightweight in upsizing and forming a vapor deposition pattern with high definition while securing strength, a method for producing a vapor deposition mask and a vapor deposition mask preparation body capable of simply producing the vapor deposition mask, and furthermore, a method for producing an organic semiconductor element capable of producing an organic semiconductor element with high definition.
A metal mask 10 in which a plurality of slits 15 are provided and a resin mask 20 are stacked. Openings 25 required for composing a plurality of screens are provided in the resin
(Continued)

mask 20. The openings 25 correspond to a pattern to be produced by vapor deposition. Each of the slits 15 is provided at a position of overlapping with an entirety of at least one screen.

24 Claims, 14 Drawing Sheets

(51) Int. Cl.
| | | |
|---|---|---|
| *B23K 26/082* | (2014.01) | |
| *B23K 26/382* | (2014.01) | |
| *B23K 26/40* | (2014.01) | |
| *B23K 26/06* | (2014.01) | |
| *H01L 51/00* | (2006.01) | |
| *C23C 14/04* | (2006.01) | |
| *B05C 21/00* | (2006.01) | |
| *B23K 101/40* | (2006.01) | |
| *B23K 103/00* | (2006.01) | |
| *B23K 103/16* | (2006.01) | |

(52) U.S. Cl.
CPC ........ *B23K 26/0661* (2013.01); *B23K 26/082* (2015.10); *B23K 26/382* (2015.10); *B23K 26/40* (2013.01); *C23C 14/042* (2013.01); *H01L 27/3211* (2013.01); *H01L 51/0011* (2013.01); *B23K 2101/40* (2018.08); *B23K 2103/172* (2018.08); *B23K 2103/50* (2018.08)

(56) References Cited

U.S. PATENT DOCUMENTS

| | | |
|---|---|---|
| 2010/0206222 A1 | 8/2010 | Sung et al. |
| 2013/0015444 A1 | 1/2013 | Hirai |
| 2014/0377903 A1 | 12/2014 | Takeda |
| 2015/0037928 A1 | 2/2015 | Hirobe et al. |
| 2016/0197312 A1* | 7/2016 | Nirengi ............... H01L 51/0013 438/28 |

FOREIGN PATENT DOCUMENTS

| | | | | |
|---|---|---|---|---|
| CN | 104053813 A | | 9/2014 | |
| JP | 07-300664 | | 11/1995 | |
| JP | 2003-332057 | | 11/2003 | |
| JP | 2004-043898 | * | 2/2004 | ............. C23C 14/24 |
| JP | 2004-190057 | | 7/2004 | |
| JP | 2010-242141 | | 10/2010 | |
| JP | 2015-165051 | | 9/2015 | |
| WO | 2013/105643 | | 7/2013 | |
| WO | WO-2013105642 A1 | * | 7/2013 | ........... C23C 14/042 |

OTHER PUBLICATIONS

International Search Report (PCT/JP2014/058049) dated Apr. 28, 2014.

\* cited by examiner

VAPOR DEPOSITION MASK, VAPOR DEPOSITION MASK PREPARATION BODY, METHOD FOR PRODUCING VAPOR DEPOSITION MASK, AND METHOD FOR PRODUCING ORGANIC SEMICONDUCTOR ELEMENT

CROSS-REFERENCE TO RELATED APPLICATIONS

This application is a Continuation of U.S. application Ser. No. 14/783,736, filed Oct. 9, 2015, which is a 371 National Stage of PCT/JP2014/058049, filed Mar. 24, 2014, the entireties of which are incorporated herein by reference, and claims the benefit under 35 USC § 119(a)-(d) of Japanese Application No. 2013-084276 filed on Apr. 12, 2013, Japanese Application No. 2013-084277 filed on Apr. 12, 2013, and Japanese Application No. 2014-059431 filed on Mar. 24, 2014.

TECHNICAL FIELD

The present invention relates to a vapor deposition mask, a vapor deposition mask preparation body, a method for producing a vapor deposition mask, and a method for producing an organic semiconductor element.

BACKGROUND ART

Conventionally, in production of an organic EL element, a vapor deposition mask that is composed of a metal formed by a number of microscopic slits being arranged in parallel with one another at microscopic spaces in a region that should be subjected to vapor deposition, for example, has been used in formation of an organic layer or a cathode electrode of an organic EL element. While in the case of using the vapor deposition mask, the vapor deposition mask is placed on a substrate front surface that should be subjected to vapor deposition and is held by using a magnet from a back surface, the rigidity of the slits is extremely small, and therefore, distortion easily occurs to the slits when the vapor deposition mask is held on the substrate front surface, which becomes an obstacle to enhancement in definition or upsizing of the products in which the slit lengths are large.

Various studies have been made on the vapor deposition masks for preventing distortion of slits, and, for example, Patent Literature 1 proposes a vapor deposition mask including a base plate that also serves a first metal mask including a plurality of openings, a second metal mask including a number of microscopic slits in regions to cover the aforementioned openings, and a mask pulling and holding device that positions the second metal mask on the base plate in a state of being pulled in the longitudinal direction of the slits. Namely, the vapor deposition mask with two kinds of metal masks being combined is proposed. It is indicated that according to the vapor deposition mask, slit precision can be ensured without occurrence of distortion to the slits.

Incidentally, in recent years, with upsizing of the products using organic EL elements or increase in substrate sizes, a demand for upsizing is also growing with respect to vapor deposition masks, and the metal plates for use in production of the vapor deposition masks composed of metals are also upsized. However, with the present metal processing technique, it is difficult to form slits in a large metal plate with high precision, and even if distortion in slit portions can be prevented by the method proposed in the above-described Patent Literature 1 or the like, these cannot respond to enhancement in definition of the slits. Further, in the case of use of a vapor deposition mask composed of only a metal, the weight thereof also increases with upsizing, and the total mass including a frame also increases, which becomes a hindrance to handling.

In the vapor deposition mask proposed above, in order to reduce the weight of the vapor deposition mask, it is needed that the thickness of the vapor deposition mask composed of a metal be made small. However, in the case where the thickness of the vapor deposition mask composed of a metal is made small, the strength of the vapor deposition mask decreases by that amount, and there arise the new problems that the vapor deposition mask suffers deformation and that handling becomes difficult.

CITATION LIST

Patent Literature

[Patent Literature 1]
Japanese Patent Laid-Open No. 2003-332057

SUMMARY OF INVENTION

Technical Problem

The present invention is devised in view of the above-mentioned circumstances, and primary objects thereof are to provide a vapor deposition mask capable of satisfying both high definition and lightweight in upsizing and forming a vapor deposition pattern with high definition while the strength is secured, to provide a method for producing a vapor deposition mask and a vapor deposition mask preparation body capable of simply producing the vapor deposition mask, and furthermore, to provide a method for producing an organic semiconductor element capable of producing an organic semiconductor element excellent in precision.

Solution to Problem

According to the present invention to solve the above-mentioned problems, there is provided a vapor deposition mask for simultaneously forming vapor deposition patterns for a plurality of screens, including: a metal mask in which a plurality of slits are provided; and a resin mask, the metal mask and the resin mask being stacked, wherein openings required for composing the plurality of screens are provided in the resin mask, the openings correspond to a pattern to be produced by vapor deposition, and each of the slits is provided at a position of overlapping with an entirety of at least one screen.

Moreover, according to the present invention to solve the above-mentioned problems, there is provided a vapor deposition mask including: a metal mask in which one through hole is provided; and a resin mask in which a plurality of openings corresponding to a pattern to be produced by vapor deposition are provided, the metal mask and the resin mask being stacked, wherein all of the plurality of openings are provided at a position of overlapping with the one through hole.

Moreover, according to the present invention to solve the above-mentioned problems, there is provided a vapor deposition mask preparation body for obtaining a vapor deposition mask including: a metal mask in which a plurality of slits are provided; and a resin mask, the metal mask and the resin mask being stacked, openings required for composing a plurality of screens provided in the resin mask, the openings corresponding to a pattern to be produced by vapor deposition, each of the slits provided at a position of overlapping with an entirety of at least one screen, wherein the metal mask in which the slits are provided is stacked on one surface of a resin plate, and each of the slits is provided at a position of overlapping with an entirety of the openings which compose one screen and are finally provided in the resin plate.

Moreover, according to the present invention to solve the above-mentioned problems, there is provided a vapor deposition mask preparation body for obtaining a vapor deposition mask including: a metal mask in which one through hole is provided; and a resin mask in which a plurality of openings corresponding to a pattern to be produced by vapor deposition are provided, the metal mask and the resin mask being stacked, all of the plurality of openings provided at a position of overlapping with the one through hole, wherein the metal mask in which slits are provided is stacked on one surface of a resin plate, and each of the one through hole is provided at a position of overlapping with an entirety of the openings which are finally provided in the resin plate.

Moreover, according to the present invention to solve the above-mentioned problems, there is provided a method for producing a vapor deposition mask, including: a step of preparing a resin plate-equipped metal mask which includes a metal mask in which a plurality of slits are provided and a resin plate stacked with each other; and a resin mask forming step of forming openings required for composing a plurality of screens in the resin plate by irradiation with laser from the metal mask side, wherein as the metal mask, a metal mask in which the slit is provided at a position of overlapping with an entirety of at least one screen out of the plurality of screens is used.

Moreover, according to the present invention to solve the above-mentioned problems, there is provided a method for producing a vapor deposition mask, including: a step of preparing a resin plate-equipped metal mask which includes a metal mask in which one through hole is provided and a resin plate stacked with each other; and a resin mask forming step of forming a plurality of openings at a position of overlapping with the one through hole in the resin plate by irradiation of laser from the metal mask side.

Moreover, in the above-mentioned producing method, after fixing the resin plate equipped metal mask onto a frame, the resin mask forming step may be performed.

Moreover, according to the present invention to solve the above-mentioned problems, there is provided a method for producing an organic semiconductor element, including a step of forming a vapor deposition pattern on a vapor deposition target by using a frame-equipped vapor deposition mask in which a vapor deposition mask is fixed to a frame, wherein the vapor deposition mask which is fixed to the frame in the step of forming the vapor deposition pattern is a vapor deposition mask including: a metal mask in which a plurality of slits are provided; and a resin mask, the metal mask and the resin mask being stacked, openings required for composing a plurality of screens are provided in the resin mask, and each of the slits is provided at a position of overlapping with an entirety of at least one screen.

Moreover, according to the present invention to solve the above-mentioned problems, there is provided a method for producing an organic semiconductor element, including a step of forming a vapor deposition pattern on a vapor deposition target by using a frame-equipped vapor deposition mask in which a vapor deposition mask is fixed to a frame, wherein the vapor deposition mask which is fixed to the frame in the step of forming the vapor deposition pattern is a vapor deposition mask including: a metal mask in which one through hole is provided; and a resin mask in which a plurality of openings corresponding to a pattern to be produced by vapor deposition are provided, the metal mask and the resin mask being stacked, and all of the plurality of openings are provided at a position of overlapping with the one through hole.

Advantageous Effect of Invention

According to the vapor deposition mask of the present invention, both high definition and lightweight in upsizing can be satisfied, and a vapor deposition pattern with high definition can be formed while the strength of the vapor deposition mask is secured as a whole. Moreover, according to the vapor deposition mask preparation body and the method for producing a vapor deposition mask of the present invention, the vapor deposition mask characteristic in the above can be simply produced. Moreover, according to the method for producing an organic semiconductor element of the present invention, an organic semiconductor element can be produced excellent in precision.

DESCRIPTION OF EMBODIMENTS

Hereafter, a vapor deposition mask 100 of an embodiment of the present invention is specifically described with use of the drawings separately for Embodiment (A) and Embodiment (B).

<Vapor Deposition Mask of Embodiment (A)>

Figure 1:
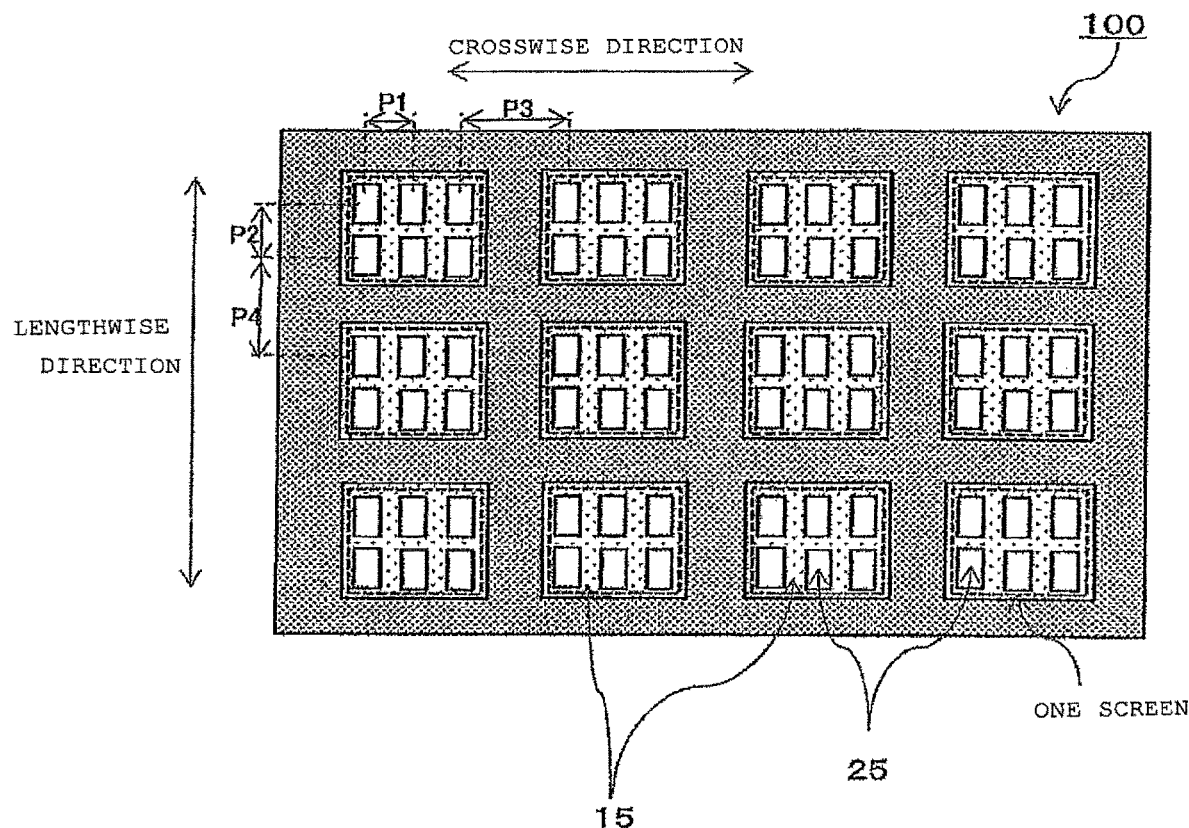
FIG. 1 is an elevation view of a vapor deposition mask of Embodiment (A) as seen from a metal mask side.
Figure 2:
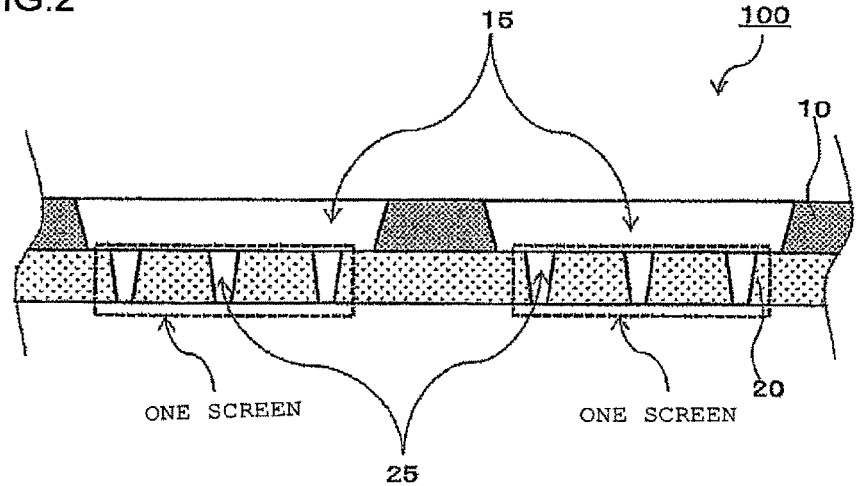
FIG. 2 is a partial expanded cross-sectional view of the vapor deposition mask shown in FIG. 1.
Figure 3:
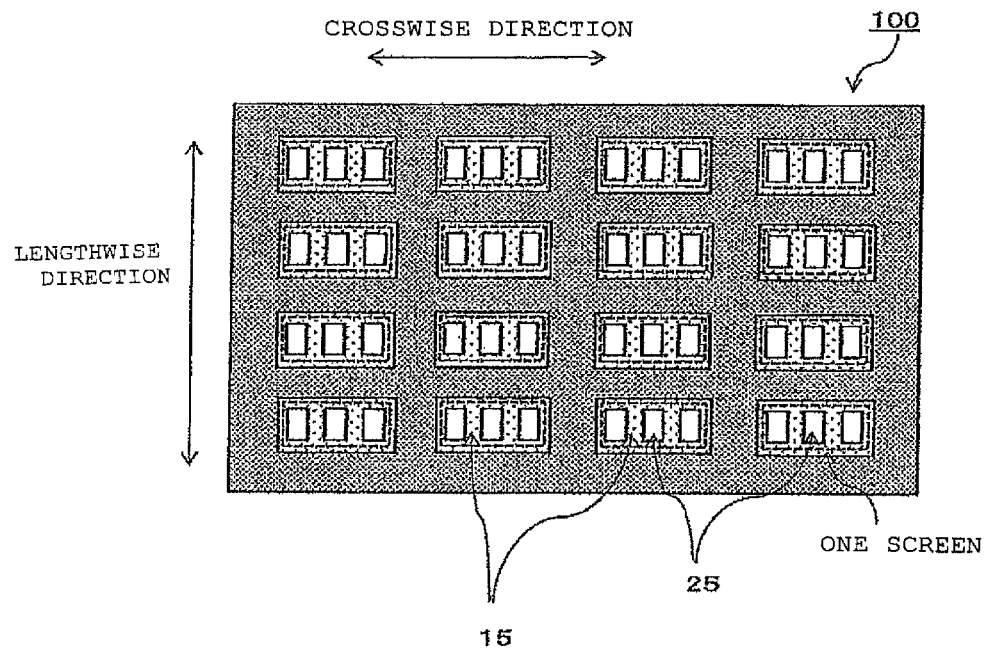
FIG. 3 is an elevation view of the vapor deposition mask of Embodiment (A) as seen from the metal mask side.
Figure 4:
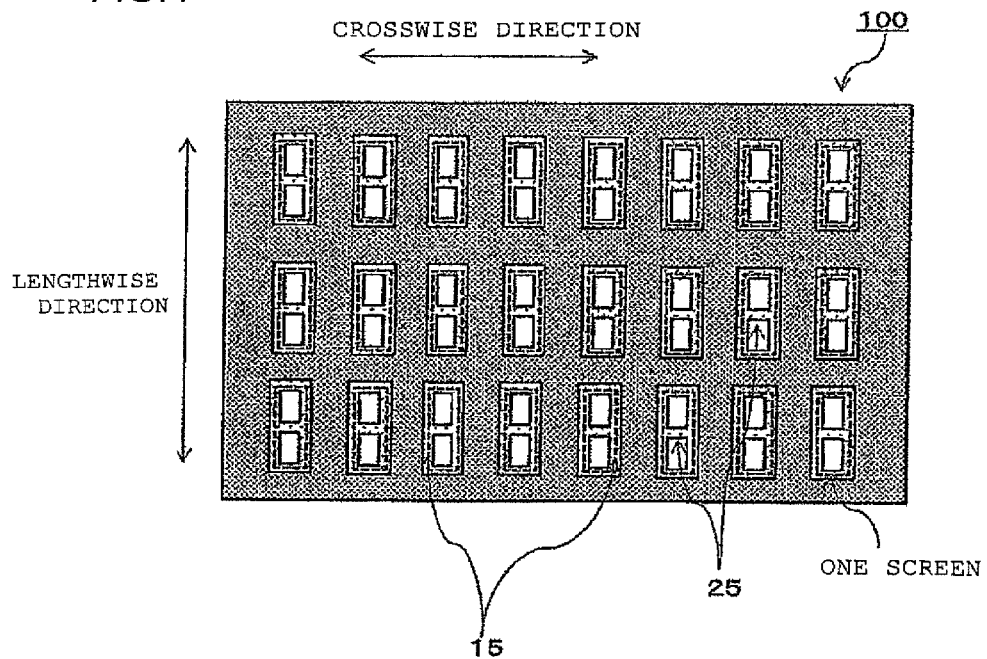
FIG. 4 is an elevation view of the vapor deposition mask of Embodiment (A) as seen from the metal mask side.
Figure 5:
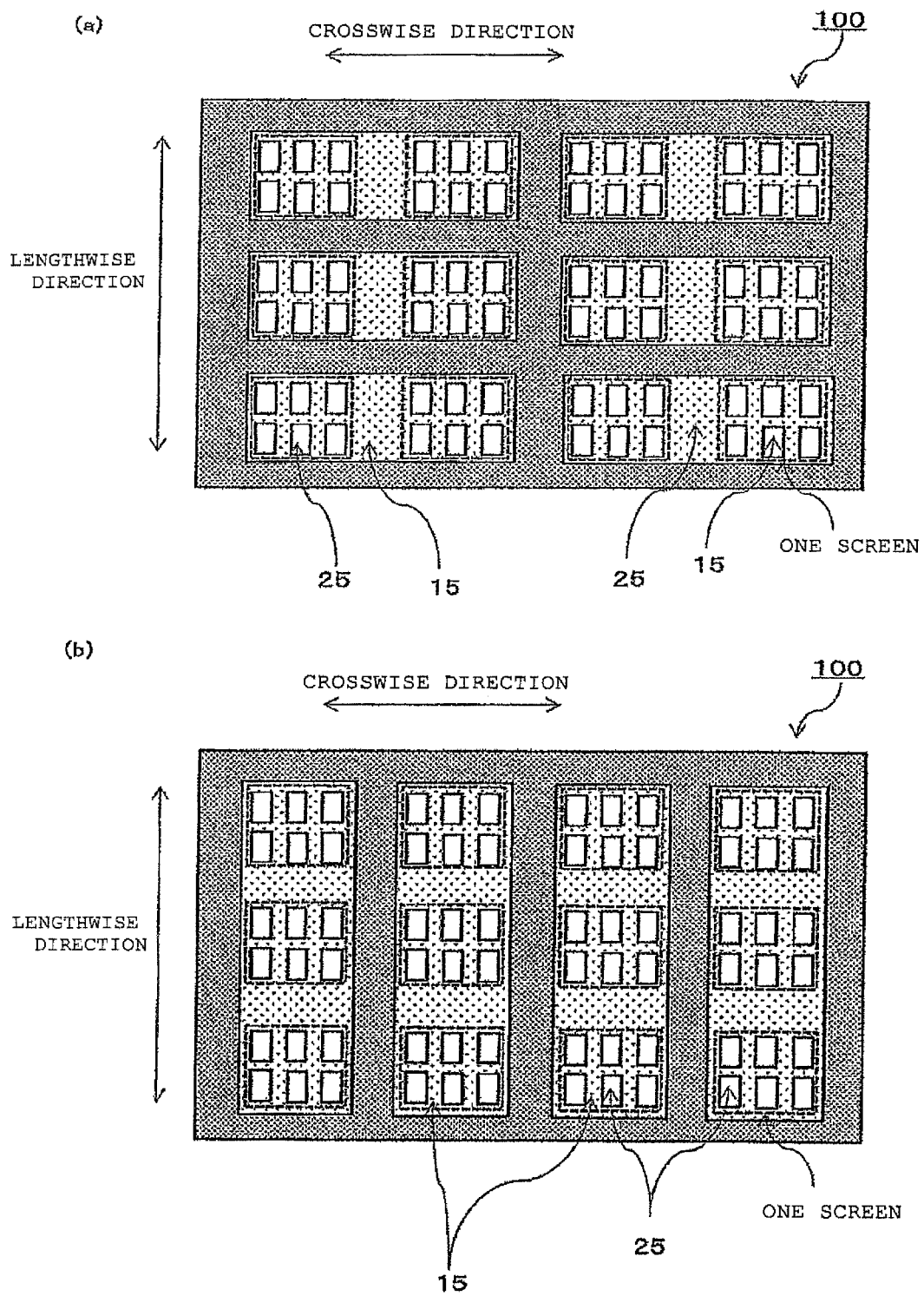
FIG. 5 is an elevation view of the vapor deposition mask of Embodiment (A) as seen from the metal mask side.
Figure 6:
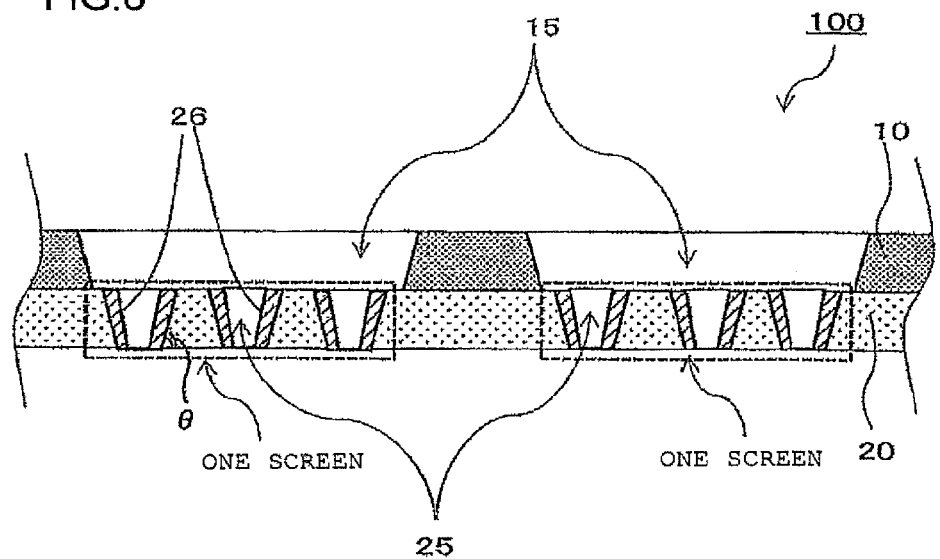
FIG. 6 is a partial expanded cross-sectional view of the vapor deposition mask of Embodiment (A).

As shown in FIG. 1 to FIG. 7 and FIG. 9, a vapor deposition mask 100 of Embodiment (A) is a vapor deposition mask for simultaneously forming vapor deposition patterns for a plurality of screens, including: a metal mask 10 in which a plurality of slits 15 are provided; and a resin mask 20, the metal mask 10 and the resin mask 20 stacked, wherein openings 25 required for composing the plurality of screens are provided in the resin mask 20, and each of the slits 15 is provided at a position of overlapping with an entirety of at least one screen. Notably, FIG. 1, FIG. 3 to FIG. 5 and FIG. 9 are elevation views of the vapor deposition mask of Embodiment (A) as seen from the metal mask side. FIG. 2 and FIG. 6 are partial expanded schematic cross-sectional views of the vapor deposition mask shown in FIG. 1.

The vapor deposition mask 100 of Embodiment (A) is a vapor deposition mask used for simultaneously forming vapor deposition patterns for a plurality of screens. One vapor deposition mask 100 can simultaneously form vapor deposition patterns compatible with a plurality of products. "Openings" stated in the present specification moan patterns to be produced with use of the vapor deposition masks of Embodiment (A) and Embodiment (B). For example, when the relevant vapor deposition mask is used for forming an organic layer in an organic EL display, the shape of the openings 25 is a shape of the relevant organic layer. In the vapor deposition masks 100 of Embodiment (A) and Embodiment (B), by a vapor deposition material released from a vapor deposition source passing through the openings 25, the vapor deposition patterns corresponding to the openings 25 are formed on a vapor deposition target. Moreover, "one screen" is constituted of an aggregate of openings 25 corresponding to one product. When the relevant one product is an organic EL display, an aggregate of organic layers required for forming one organic EL display, in other words, an aggregate of openings 25 to be the organic layer is "one screen". Further, in the vapor deposition mask 100 of Embodiment (A), in order to simultaneously form the vapor deposition patterns for the plurality of screens, the above-mentioned "one screen" is arranged for each of the plurality of screens in the resin mask 20 at predetermined intervals. Namely, in the resin mask 20, the openings 25 required for composing the plurality of screens are provided.

The vapor deposition mask of Embodiment (A) includes the metal mask 10 in which the plurality of slits 15 are provided, the metal mask stacked on one surface of the resin mask, wherein each of the slits of the metal mask 10 is provided at the position of overlapping with the entirety of at least one screen. In other words, it is characterized in that between the openings 25 required for composing one screen, metal line portions which have the same length as the length of the slit 15 in the lengthwise direction and have the same thickness as that of the metal mask 10 between the openings 25 adjacent in the crosswise direction, or metal portions which have the same length as the length of the slit 15 in the crosswise direction and have the same thickness as that of the metal mask 10 in 25 between the openings adjacent in the lengthwise direction do not exist. Hereafter, the metal line portions which have the same length as the length of the slit 15 in the lengthwise direction and have the same thickness as that of the metal mask 10 and the metal line portions which have the same length as the length of the slit 15 in the crosswise direction and have the same thickness as that of the metal mask 10 are sometimes collectively referred to simply as metal portions.

According to the vapor deposition mask 100 of Embodiment (A), even when the dimension of the openings 25 required for composing one screen and the pitch between the openings 25 composing one screen are made small, for example, even when the dimension of the openings 25 and the pitch between the openings 25 are made extremely fine in order to form a screen exceeding 400 ppi, interference due to the above-mentioned metal portions can be prevented and an image with high definition can be formed. Notably, when one screen is divided by a plurality of slits, in other words, when the metal line portions exist between the openings 25 composing one screen, as the pitch between the openings 25 composing one screen is smaller, the metal portions existing between the openings 25 are needed to be finer. However, when the metal portions existing between the openings 25 composing one screen are made fine, a frequency at which the relevant metal portions suffer rupture is high, and the metal portions suffering rupture sometimes affect disadvantageously at the time of vapor deposition.

Moreover, when the metal portions exist between the openings 25 composing one screen, the relevant metal portions cause generation of a shadow and make formation of a screen with high definition difficult. Notably, the shadow is a phenomenon that a part of the vapor deposition material released from the vapor deposition source collides with the inner wall surface of the slit 15 of the metal mask 10 and does not reach the vapor deposition target, and thereby, a portion without vapor deposition that has a film thickness smaller than the intended vapor deposition film thickness arises. In particular, as the shape of the openings 25 is finer, the influence due to the shadow caused by the metal portions existing between the openings 25 in one screen is larger. In other words, in the vapor deposition mask of Embodiment (A), it is in that the slit is provided at the position of overlapping with the entirety of at least one screen, that is, metal portions are caused not to exist between the openings 25 composing one screen, and thereby, durability of the vapor deposition mask and prevention of the influence of a shadow are achieved.

Moreover, the vapor deposition mask 100 of Embodiment (A) can be lighter in weight as compared with a conventional vapor deposition mask. Specifically, when the mass of the vapor deposition mask 100 of Embodiment (A) and the mass of a conventionally known vapor deposition mask composed of only metal are compared on the assumption that the thicknesses of the vapor deposition masks are the same as a whole, the mass of the vapor deposition mask 100 of Embodiment (A) is lighter by an amount by which the metal material of the conventionally known vapor deposition mask is partially replaced with a resin material. Moreover, in order to reduce weight by using the vapor deposition mask composed of only metal, there are a requirement that the thickness of the relevant vapor deposition mask should be made small and the similar requirement, but in the case where the thickness of the vapor deposition mask is made small, there can arise the case where distortion is generated in the vapor deposition mask and the case where durability deteriorates when upsizing the vapor deposition mask. Meanwhile, according to the vapor deposition mask of Embodiment (A), even when the thickness of the vapor deposition mask is made large as a whole to satisfy distortion and durability in upsizing, reduction in weight can be achieved more than the vapor deposition mask formed of only metal by the presence of the resin mask 20. Hereafter, each of these is specifically described. The same holds true for the vapor deposition mask of Embodiment (B) mentioned later.

(Resin Mask Constituting Vapor Deposition Mask of Embodiment (A))

For the resin mask 20 constituting the vapor deposition mask of Embodiment (A), a conventionally known resin material can be properly selected and used, and while the material is not specially limited, a material that enables formation of the opening 25 with high definition by laser processing or the like, has a low rate of dimensional change and a low rate of humidity absorption under heat and with passage of time, and is lightweight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials shown in the above, the resin materials with the thermal expansion coefficients of 16 ppm/° C. or less are preferable, the resin materials with the rates of humidity absorption of 1.0% or less are preferable, and the resin materials including both conditions are especially preferable. The resin mask using this resin material can improve dimensional accuracy of the opening 25, and enables a rate of dimensional change and a rate of humidity absorption under heat and with passage of time to be small. In the vapor deposition mask of Embodiment (A), the resin mask 20 is composed of the resin material as mentioned above which enables formation of the opening 25 with high definition as compared with a metal material. This can make the vapor deposition mask 100 have the opening 25 with high definition. The same holds true for the vapor deposition mask of Embodiment (B).

While the thickness of the resin mask 20 is not specially limited, the resin mask 20 is preferably as thin as possible in order to prevent a vapor deposition portion with a film thickness smaller than the intended vapor deposition film thickness, a so-called shadow, from arising when vapor deposition is performed with use of the vapor deposition mask 100 of Embodiment (A). However, when the thickness of the resin mask 20 is less than 3 μm, a defect such as a pinhole easily occurs, and the risk of deformation or the like increases. Meanwhile, in the case of exceeding 25 μm, generation of a shadow can arise. With this point taken into consideration, the thickness of the resin mask 20 is preferably from 3 μm to 25 μm inclusive. By setting the thickness of the resin mask 20 within this range, the defect such as a pinhole and the risk of deformation or the like can be reduced, and generation of a shadow can be effectively prevented. In particular, the thickness of the resin mask 20 is set to be from 3 μm to 10 μm inclusive, more preferably, from 4 μm to 8 μm inclusive, whereby the influence of a shadow at the time of forming a high-definition pattern exceeding 400 ppi can be prevented more effectively. Moreover, in the vapor deposition mask of Embodiment (A), even when the thickness of the resin mask 20 is made small within the above-mentioned preferable range, the presence of the metal mask 10 provided on the resin mask 20 can satisfy durability and handling ability of the entirety of the vapor deposition mask 100. The same holds true for the vapor deposition mask of Embodiment (B).

Notably, in the vapor deposition mask 100 of Embodiment (A), the metal mask 10 and the resin mask 20 may be directly bonded, or may be bonded via an adhesive layer, and when the metal mask 10 and the resin mask 20 are bonded via the adhesive layer, with the above-mentioned point of the shadow taken into consideration, the total thickness of the resin mask 20 and the adhesive layer is preferably set to be within a range from 3 μm to 25 μm inclusive, preferably from 3 μm to 10 μm inclusive, and particularly preferably from 4 μm to 8 μm inclusive. The same holds true for the vapor deposition mask of Embodiment (B).

Moreover, since the vapor deposition mask 100 of Embodiment (A) has a configuration in which the above-mentioned resin mask 20 and the metal mask 10 are stacked, the presence of the metal mask 10 improves durability of the entirety of the vapor deposition mask, thereby, achieving handling performance and prevention of rupture and deformation. The same holds true for the vapor deposition mask of Embodiment (B).

Next, referring to FIG. 1 and FIG. 3 to FIG. 6, the openings 25 composing one screen are exemplarily described. Notably, the region obtained by closing with a broken line in the shown modes is one screen. In the shown modes, while an aggregate of a small number of openings 25 is one screen for convenience of description, not limited to these modes, for example, the openings 25 for millions of pixels may present in one screen, where one opening 25 is one pixel.

In the mode shown in FIG. 1, one screen is composed of an aggregate of openings 25 having a plurality of openings 25 provided in the lengthwise direction and the crosswise direction. In the mode shown in FIG. 3, one screen is composed of an aggregate of openings 25 having a plurality of openings 25 provided in the crosswise direction. Moreover, in the mode shown in FIG. 4, one screen is composed of an aggregate of openings 25 having a plurality of openings 25 in the lengthwise direction. Further, in FIG. 1, FIG. 3 and FIG. 4, the slit 15 is provided at a position of overlapping with the entirety of one screen.

As described above, the slit 15 of the metal mask 10 may be provided at a position of overlapping with only one screen, or as shown in FIG. 5(*a*) and FIG. 5(*b*), the slit 15 may be provided at a position of overlapping with the entirety of two or more screens. In FIG. 5(*a*), in the resin mask shown in FIG. 1, the slit 15 is provided at a position of overlapping with the entirety of two screens continuous in the crosswise direction. In FIG. 5(*b*), the slit 15 is provided at a position of overlapping with the entirety of three screens continuous in the lengthwise direction. Notably, in the case of overlapping one slit with the entirety of a plurality of screens, as a ratio of a region occupied by the slits 15 relative to the entire surface of the metal mask 10 is larger, a ratio of a metal portion provided on the resin mask occupying relative thereto decreases more, and durability of the entirety of the vapor deposition mask 100 tends to decrease more. Accordingly, in the case of overlapping one slit with the entirety of a plurality of screens, the setting is needed to be properly done with durability of the entirety of the vapor deposition mask 100 taken into consideration.

Next, exemplified by the mode shown in FIG. 1, pitches between the openings 25 composing one screen and pitches between the screens are described. The pitches between the openings 25 composing one screen and the dimension of the opening 25 are not specially limited, but can be properly set depending on the pattern to be produced by vapor deposition. For example, when forming the vapor deposition pattern with high definition of 400 ppi, a pitch (P1) in the crosswise direction and a pitch (P2) in the lengthwise direction between the neighboring openings 25 out of the openings 25 composing one screen are approximately 60 μm. Moreover, the dimension of the opening is approximately 500 μm² to 1000 μm². Moreover, one opening 25 is not limited to correspond to one pixel, but, for example, a plurality of pixels can be collectively one opening 25 depending on a pixel arrangement.

While a pitch (P3) in the crosswise direction and a pitch (P4) in the lengthwise direction between the screens are not specially limited, as shown in FIG. 1, when one slit 15 is provided at the position of overlapping with the entirety of one screen, metal portions are to exist between the screens. Accordingly, when the pitch (P3) in the crosswise direction and the pitch (P4) in the lengthwise direction between the screens are smaller than or substantially equal to the pitch (P1) in the crosswise direction and the pitch (P2) in the lengthwise direction of the openings 25 provided in one screen, the metal portions existing between the screens is liable to break. Accordingly, with this point taken into consideration, the pitch (P3, P4) between the screens is preferably wider than the pitch (P1, P2) between the openings 25 composing one screen. An example of the pitch (P3, P4) between the screens is approximately 1 mm to 100 mm. Notably, the pitch between the screens means the pitch between the neighboring openings in one screen and another screen adjacent to the relevant one screen.

Notably, as shown in FIG. 5, when one slit 15 is provided at the position of overlapping with the entirety of two or more screens, metal portions are not to exist between the plurality of screens provided in the one slit 15. Accordingly, in this case, the pitch between the two or more screens provided at the position of overlapping with the one slit 15 may be substantially equal to the pitch between the openings 25 composing one screen.

Figure 16:
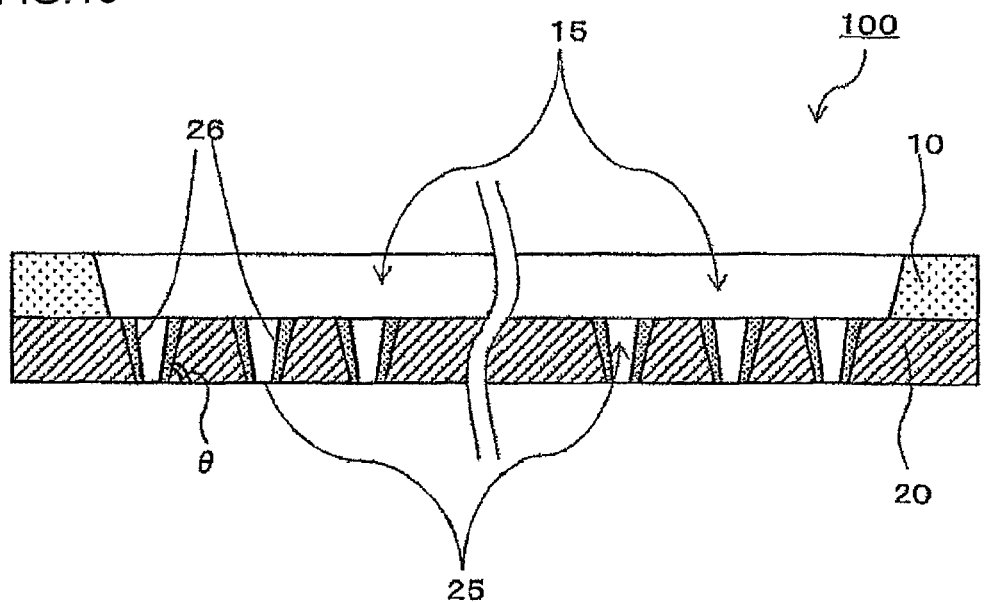
FIG. 16 is a partial expanded cross-sectional view of the vapor deposition mask of Embodiment (B).

The sectional shape of the opening 25 is not specially limited, and end surfaces that face each other of the resin mask forming the opening 25 may be substantially parallel to each other, but as shown in FIG. 2 and FIG. 6, the sectional shape of the opening 25 is preferably the shape having broadening toward a vapor deposition source. In other words, it preferably has a taper surface having broadening toward the metal mask 10 side. By making the sectional shape of the opening 25 have the above configuration, a shadow can be prevented from being generated in the pattern that is produced by vapor deposition when vapor deposition is performed with use of the vapor deposition mask of Embodiment (A). While a taper angle θ can be properly set with the thickness or the like of the resin mask 20 taken into consideration, an angle formed by a straight line connecting a lower bottom distal end in the opening of the resin mask and an upper bottom distal end of the opening of the same resin mask and the bottom surface of the resin mask 20, in other words, an angle (θ) formed by an inner wall surface of the opening 25 and a surface of the resin mask 20 on the side that is not in contact with the metal mask 10 (a lower surface of the resin mask in the shown mode) in the cross section in the thickness direction of the inner wall surface composing the opening 25 of the resin mask 20 is preferably within a range of 5° to 85°, more preferably within a range of 15° to 80°, further preferably within a range of 25° to 65°. In particular, within this range, it is preferably an angle smaller than a vapor deposition angle of a vapor deposition machine to be used. Furthermore, in FIG. 2 and FIG. 6, an end surface that forms the opening 25 shows a linear shape, but is not limited thereto, and may be in a curved shape protruding outward, in other words, a shape of the entirety of the opening 25 may be in a bowl shape. The opening 25 that has the sectional shape like this can be formed by performing multistage laser irradiation that properly adjusts the irradiation position of the laser and irradiation energy of the laser at the time of formation of the opening 25, or changes the irradiation position stepwise, for example. Notably, FIG. 2 and FIG. 6 are partial expanded cross-sectional views exemplarily showing the vapor deposition mask 100 in the mode shown in FIG. 1. The same holds true for the vapor deposition mask of Embodiment (B), and FIG. 2 and FIG. 6 only have to be read as FIG. 12 and FIG. 16.

Since a resin material is used for the resin mask 20, formation of the opening 25 is enabled without using the processing methods that are used in the conventional metal processing, for example, the processing methods such as etching and cutting. In other words, the method for forming the opening 25 is not specially limited, and the opening 25 can be formed by using various processing methods, for example, a laser processing method capable of forming the opening 25 with high definition, precision press processing, photolithography processing and the like. The method for forming the opening 25 by a laser processing method or the like will be described later. The same holds true for the vapor deposition mask of Embodiment (B).

As the etching processing method, for example, a wet etching method such as a spray etching method that sprays an etching agent at a predetermined spray pressure from an injection nozzle, an immersion etching method that immerses an object in an etching solution filled with an etching agent, and a spin etching method that drops an etching agent, and a dry etching method using gas, plasma and the like can be used. The same holds true for the vapor deposition mask of Embodiment (B).

Moreover, in the vapor deposition mask of Embodiment (A), since the resin mask 20 is used as the configuration of the vapor deposition mask 100, when vapor deposition is performed with use of this vapor deposition mask 100, exceedingly high heat is applied to the opening 25 of the resin mask 20, and risks that gas is generated from the end surface forming the opening 25 of the resin mask 20 (refer to FIG. 6) to lower the degree of vacuum in the vapor deposition apparatus can arise. Accordingly, with this point taken into consideration, as shown in FIG. 6, a barrier layer 26 is preferably provided on the end surface forming the opening 25 of the resin mask 20. By forming the barrier layer 26, gas can be prevented from being generated from the end surface forming the opening 25 of the resin mask 20. The same holds true for the vapor deposition mask of Embodiment (B), and FIG. 6 only has to be read as FIG. 16.

As the barrier layer 26, a thin film layer or a vapor deposition layer of an inorganic oxide, an inorganic nitride or metal can be used. As the inorganic oxide, an oxide of aluminum, silicon, indium, tin or magnesium can be used, and as the metal, aluminum or the like can be used. The thickness of the barrier layer 26 is preferably approximately 0.05 µm to 1 µm. The same holds true for the vapor deposition mask of Embodiment (B).

Furthermore, the barrier layer 26 preferably covers the vapor deposition source-side surface of the resin mask 20 (not-shown). By covering the vapor deposition source-side surface of the resin mask 20 with the barrier layer 26, barrier ability is further improved. In the case of an inorganic oxide and an inorganic nitride, the barrier layer is preferably formed by various PVD (physical vapor deposition) methods and CVD (chemical vapor deposition) methods. In the case of metal, the formation is preferably performed by various PVD methods such as a sputtering method, ion plating, a vacuum vapor deposition method, in particular, the vacuum vapor deposition method. Notably, the vapor deposition source-side surface of the resin mask 20 here may be the entirety of the surface on the vapor deposition source side of the resin mask 20, or may be only the part that is exposed from the metal mask on the surface of the resin mask 20 on the vapor deposition source side. The same holds true for the vapor deposition mask of Embodiment (B).

Moreover, in the case where a magnet or the like is disposed at a rear side of the vapor deposition target to attract the vapor deposition mask 100 at a front side of the vapor deposition target with magnetic force, and thereby, the vapor deposition mask of Embodiment (A) and the vapor deposition target are brought into close contact with each other when vapor deposition is performed on the vapor deposition target with use of the vapor deposition mask of Embodiment (A), a magnetic layer (not-shown) composed of a magnetic material is preferably provided on the side, of the resin mask 20, that is not in contact with the metal mask 10. By providing the magnetic layer, the relevant magnetic layer and the vapor deposition target are caused to be attracted with magnetic force, the vapor deposition mask of Embodiment (A) and the vapor deposition target are sufficiently brought into close contact with each other without a gap, and thickening of the vapor deposition pattern which can arise caused by the gap between the vapor deposition mask of Embodiment (A) and the vapor deposition target can be prevented. Specifically, in the vapor deposition mask of Embodiment (A), since metal portions do not exist between the openings 25 composing one screen, the vapor deposition mask 100 of Embodiment (A) and the vapor deposition target cannot be brought into close contact with each other in the region corresponding to one screen. Meanwhile, in the case of providing the magnetic layer, since the vapor deposition mask 100 of Embodiment (A) and the vapor deposition target can be brought into close contact with each other also in the region where the relevant magnetic layer is provided, by providing the magnetic layer on the region corresponding to one screen of the resin mask 20, close contact of the vapor deposition mask 100 of Embodiment (A) and the vapor deposition target with each other can be excellent. The thickening of the vapor deposition pattern is a phenomenon that a vapor deposition pattern with a larger shape than that of the intended vapor deposition pattern is formed. Notably, in the case where the vapor deposition mask 100 of Embodiment (A) and the vapor deposition target are brought into contact with each other by a method other than that of attraction with magnetic force, to provide the magnetic layer is not specially needed. The same holds true for the vapor deposition mask of Embodiment (B).

As the material of the magnetic layer, for example, iron, nickel, cobalt, alloy containing these metals, or the like can be cited. The thickness of the magnetic layer is not specially limited, but is preferably from 0.05 µm to 1 µm inclusive. The same holds true for the vapor deposition mask of Embodiment (B).

Figure 7:
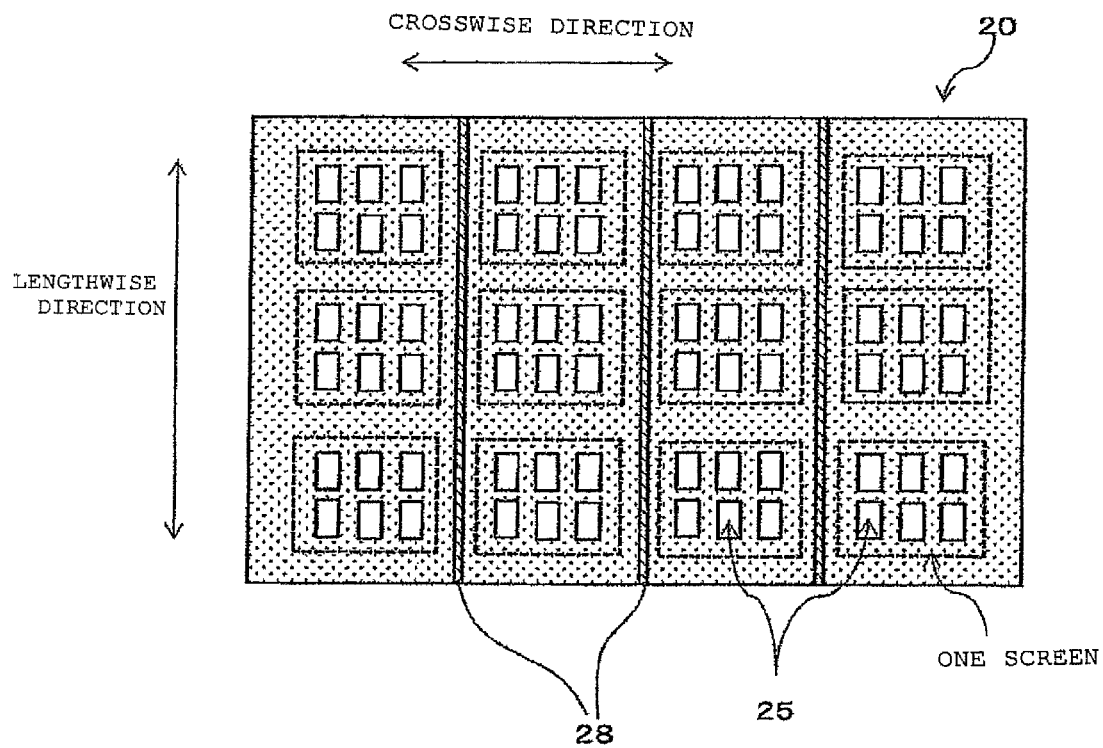
FIG. 7 is an elevation view of the vapor deposition mask of Embodiment (A) as seen from a resin mask side.

FIG. 7 is an elevation view of another aspect of the resin mask. As shown in FIG. 7, on the resin mask 20, grooves 28 are preferably formed to extend in the lengthwise direction or the crosswise direction of the resin mask 20 (the lengthwise direction in the case of FIG. 7). While in the case of application of heat in vapor deposition, there is a possibility that the resin mask 20 undergoes thermal expansion, and thereby, changes in dimension and position of the opening 25 arise, by forming the relevant grooves 28, they can absorb the expansion of the resin mask, and can prevent the changes in dimension and position of the opening 25 caused by the resin mask 20 expanding in a predetermined direction as a whole due to accumulation of thermal expansions arising in portions in the resin mask. Formation positions of the grooves 28 are not limited, but while they may be provided between the openings 25 composing one screen and at positions of overlapping with the openings 25, they may be preferably provided between the individual screens. Moreover, the grooves may be provided on one surface of the resin mask, for example, only on the surface on the side that is in contact with the metal mask, or may be provided only on the surface on the side that is not in contact with the metal mask. Otherwise, they may be provided on both surfaces of the resin mask 20.

In FIG. 7, while the grooves 28 extending in the lengthwise direction are formed between the neighboring screens, not limited thereto, the grooves extending in the crosswise direction may be formed between the neighboring screens. Furthermore, the grooves can be formed in an aspect having these combined.

While the depth and the width of the grooves 28 are not specially limited, since the rigidity of the resin mask 20 tends to decrease in the case where the depth of the grooves 28 is too large and in the case where the width thereof is too large, the setting is needed with this point taken into consideration. Moreover, the sectional shape of the grooves is not specially limited, but only has to be arbitrarily selected as a U-shape, a V-shape or the like with the processing method or the like taken into consideration. The same holds true for the vapor deposition mask of Embodiment (B).

(Metal Mask Constituting Vapor Deposition Mask of Embodiment (A))

The metal mask 10 constituting the vapor deposition mask of Embodiment (A) is composed of metal and provided with a plurality of slits 15. In the vapor deposition mask of Embodiment (A), as described above, each slit 15 is provided at the position of overlapping with the entirety of at least one screen. In other words, the openings 25 composing one screen are provided at the position of overlapping with one slit 15.

Figure 8:
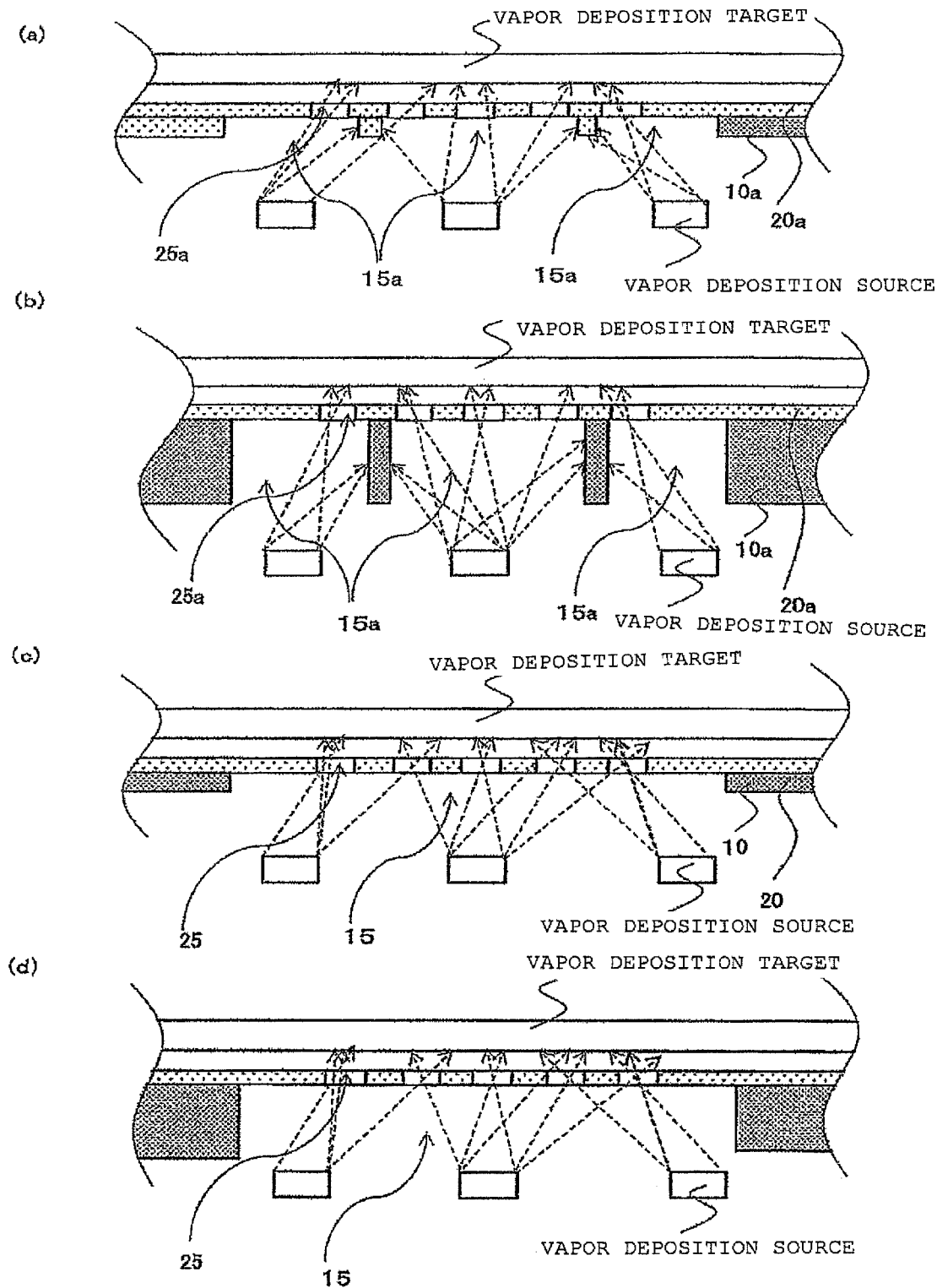
FIG. 8 is a schematic cross-sectional view showing relation between a shadow and the thickness of the metal mask.

Next, with use of FIG. 8(a) to FIG. 8(c), generation of a shadow, generation of a shadow which can arise due to the thickness of the metal mask 10, and an advantage of the vapor deposition mask 100 of Embodiment (A) in which the slit is provided at the position of overlapping with the entirety of at least one screen are described. Notably, FIG. 8(a) is a partial expanded cross-sectional view of the vapor deposition mask in which the openings 25a composing the inside of one screen are divided by a plurality of slits 15a. FIG. 8(b) is a partial expanded cross-sectional view showing the state where the thickness of the metal mask is made thicker in the vapor deposition mask shown in FIG. 8(a). FIG. 8(c) is a partial expanded cross-sectional view exemplarily showing the vapor deposition mask 100 of Embodiment (A) in which one slit 15 is provided at the position of overlapping with the entirety of one screen. FIG. 8(*d*) is a partial expanded cross-sectional view showing the state where the thickness of the metal mask 10 is made thicker in the vapor deposition mask 100 in FIG. 8(*c*). Moreover, in the shown mode, an aggregate, of the openings 25, in which five (5) openings are provided in the crosswise direction (arbitrary in the lengthwise direction) is one screen.

As shown in FIG. 8(*a*), when the openings 25*a* composing one screen are divided by the plurality of slits 15*a*, metal portions constituting a wall surface of the slit 15*a* are to exist on a part of the neighboring openings 25*a*. In the case where in order to form the vapor deposition pattern with high definition, the pitch of the openings 25*a* and the shape of the openings 25*a* are made finer, when the metal portions exist between the openings 25*a* composing one screen, the relevant metal portions prevent the vapor deposition material released from the vapor deposition source from passing into the inside of the openings 25*a*, and make the production of the vapor deposition pattern with high definition more difficult. Moreover, in the case where the thickness of the metal mask 10*a* is made smaller, durability of the entirety of the vapor deposition mask is to deteriorate more. In order to improve durability of the entirety of the vapor deposition mask, in the case where the thickness of the metal mask 10*a* is made smaller as shown in FIG. 8(*b*), the vapor deposition material released from the vapor deposition source is more liable to collide with the inner wall surfaces of the relevant metal portions. As the amount of the vapor deposition material that collides with the inner wall surfaces increases more, the amount of the vapor deposition material that cannot reach the vapor deposition target increases more, and generation of a shadow arises more significantly. Moreover, in the case where the pitch between the openings 25*a* is made narrower, the metal portions existing between the relevant openings 25*a* are needed to be finer, and the risk of breakage of the metal portions is higher. Notably, when the metal portions break, durability of the entirety of the vapor deposition mask deteriorates.

Meanwhile, in the vapor deposition mask of Embodiment (A), as shown in FIG. 8(*c*), the entirety of one screen, that is, all of the openings 25 provided in one screen are provided at the position of overlapping with one slit 15. Accordingly, as shown in FIG. 8(*c*), the vapor deposition material can be allowed to pass into the openings 25 without waste, and generation of a shadow can be prevented. Moreover, as shown in FIG. 8(*d*), even in the case where the thickness of the metal mask 10 is made large to some extent, the influence of a shadow is small, and formation of the vapor deposition pattern with high definition is enabled. In particular, in the vapor deposition mask of Embodiment (A), even in the case where the thickness of the metal mask 10 is made approximately 100 µm, generation of a shadow can be prevented. Since durability of the entirety of the vapor deposition mask 100 is improved by making the thickness of the metal mask 10 large, in the vapor deposition mask of Embodiment (A), formation of the vapor deposition pattern with high definition is enabled, and durability can be improved by properly setting the thickness.

While the thickness of the metal mask 10 is not specially limited, in order to more effectively prevent generation of a shadow in the opening 25 positioned near the inner wall surface of the slit 15, it is preferably 100 µm or less, more preferably, 50 µm or less, particularly preferably, 35 µm or less. The same holds true for the vapor deposition mask of Embodiment (B), and the slit 15 only has to be read as a through hole.

Moreover, in the vapor deposition mask 100 of Embodiment (A), in order to prevent generation of a shadow further more sufficiently, the sectional shape of the slit 15 is preferably made a shape having broadening toward the vapor deposition source, as shown in FIG. 2 and FIG. 6. By adopting the sectional shape like this, the vapor deposition material can be caused to reach the vapor deposition target without the vapor deposition material that is released from the vapor deposition source colliding with the relevant surface of the slit 15 and the inner wall surface of the slit 15 even when the thickness of the entire vapor deposition mask is made large with the objective of prevention of distortion that can occur to the vapor deposition mask 100, or improvement of durability. Specifically, the angle formed by a straight line connecting the lower bottom distal end in the slit 15 of the metal mask 10 and the upper bottom distal end in the slit 15 of the same metal mask 10 and the bottom surface of the metal mask 10 is, in other words, the angle formed by the inner wall surface in the slit 15 and the surface of the metal mask 10 on the side that is in contact with the resin mask 20 (a lower surface of the metal mask in the shown mode) in the cross section in the thickness direction of the inner wall surface composing the slit 15 of the metal mask 10 is preferably within a range of 5° to 85°, more preferably within a range of 15° to 80°, further preferably within a range of 25° to 65°. In particular, in this range, an angle that is smaller than the vapor deposition angle of the vapor deposition machine to be used is preferable. By setting the sectional shape like this, the deposition material can be caused to reach the vapor deposition target without the vapor deposition material released from the vapor deposition source colliding with the inner wall surface of the slit 15 even when the thickness of the metal mask 10 is made relatively large with the objective of prevention of distortion that can arise in the vapor deposition mask 100, or enhancement of durability. Thereby, generation of a shadow can be prevented more effectively. Notably, while the end surfaces that face each other of the opening 25 of the resin mask 20 may be substantially parallel to each other, as described above, the sectional shapes of both the slit 15 of the metal mask 10 and the opening 25 of the resin mask 20 are preferably the shapes having broadening toward the vapor deposition source side.

The material of the metal mask 10 is not specially limited, but a conventionally known material in the field of the vapor deposition mask can be properly selected and used, and, for example, a metal material such as stainless steel, an iron-nickel alloy, and an aluminum alloy can be cited. Above all, an invar material that is an iron-nickel alloy can be preferably used since an invar material is hardly deformed by heat. The same holds true for the vapor deposition mask of Embodiment (B).

Moreover, when vapor deposition is performed on the substrate with use of the vapor deposition mask 100 of Embodiment (A), in the case where a magnet or the like is needed to be disposed at a rear side of the substrate to attract the vapor deposition mask 100 at a front side of the substrate with magnetic force, the metal mask 10 is preferably formed of a magnetic substance. As the metal mask 10 made of the magnetic substance, iron-nickel alloy, pure iron, carbon steel, tungsten (W) steel, chromium (Cr) steel, cobalt (Co) steel, KS steel which is alloy of iron containing cobalt, tungsten, chromium and carbon, MK steel having iron, nickel and aluminum as main components, NKS steel having cobalt and titanium added to MX steel, Cu—Ni—Co steel, aluminum (Al)-iron (Fe) alloy, and the like can be cited. Moreover, when the material itself forming the metal mask 10 is not a magnetic substance, magnetism may be added to the metal mask 10 by dispersing powder of the above-mentioned magnetic substance in the relevant material. The same holds true for the vapor deposition mask of Embodiment (B).

Figure 9:
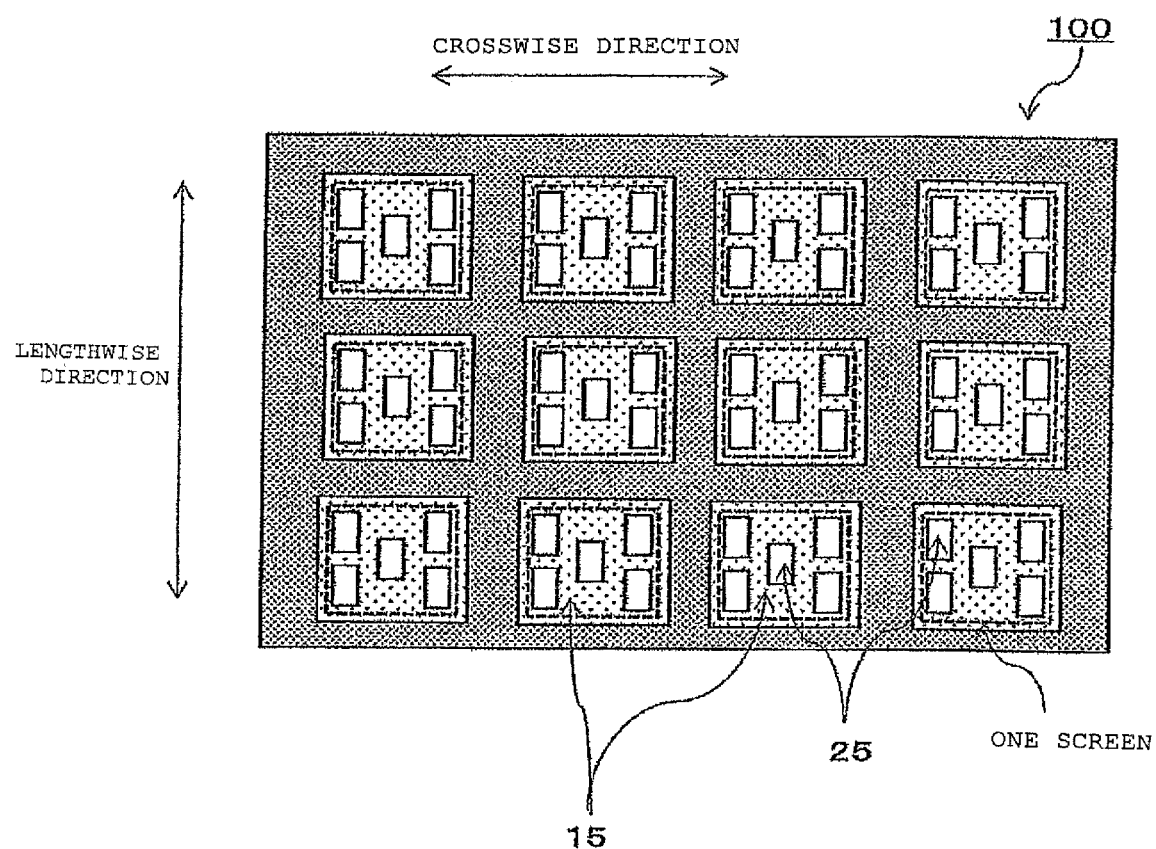
FIG. 9 is an elevation view of the vapor deposition mask of Embodiment (A) as seen from the metal mask side.

FIG. 9 is an elevation view showing another aspect of the vapor deposition mask 100 of Embodiment (A). As shown in FIG. 9, in an elevation view as seen from the metal mask 10 side of the vapor deposition mask 100, the openings 25 composing one screen may be alternately arranged in the crosswise direction. In other words, the openings 25 adjacent in the crosswise direction may be arranged to be displaced in the lengthwise direction. By the arrangement in this way, even when the resin mask 20 undergoes thermal expansion, the openings 25 can absorb expansions arising in portions, and large deformation can be prevented from arising due to accumulation of the expansions.

<Vapor Deposition Mask of Embodiment (B)>

Figure 11:
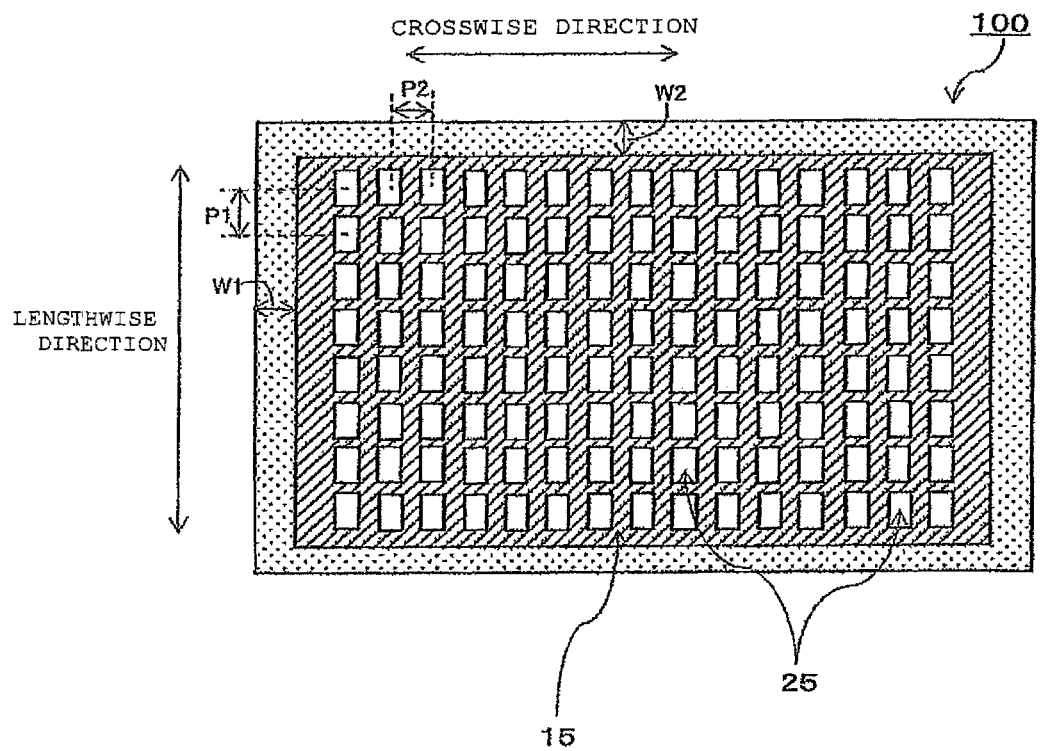
FIG. 11 is an elevation view of a vapor deposition mask of Embodiment (B) as seen from the metal mask side.
Figure 12:
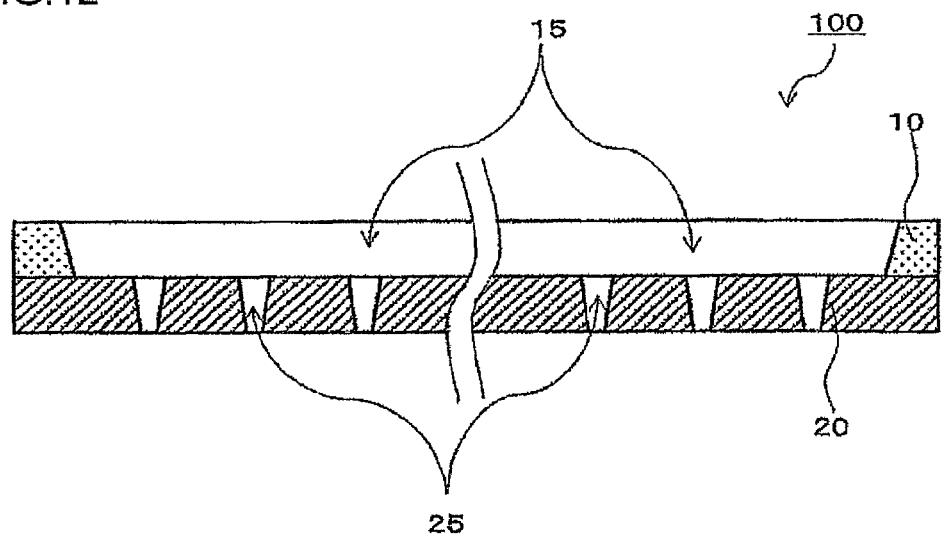
FIG. 12 is a partial expanded cross-sectional view of the vapor deposition mask shown in FIG. 11.

As shown in FIG. 11 and FIG. 12, in the vapor deposition mask of Embodiment (B), the metal mask 10 in which one through hole 15 is provided and the resin mask 20 in which a plurality of openings corresponding to a pattern to be produced by vapor deposition are provided are stacked, and all of the relevant plurality of openings 25 are provided at a position of overlapping with the one through hole provided in the metal mask 10. Notably, FIG. 11 is an elevation view of the vapor deposition mask of Embodiment (B) as seen from of the metal mask side. FIG. 12 is a partial expanded schematic cross-sectional view of the vapor deposition mask shown in FIG. 11.

According to the vapor deposition mask 100 of Embodiment (B), since the metal mask 10 is provided on the resin mask 20, durability and handling ability of the vapor deposition mask 100 can be enhanced. Notably, in the case of the vapor deposition mask constituted of only the resin mask without the metal mask 10 provided on the resin mask 20, durability and handling ability of the vapor deposition mask is to deteriorate. In particular, in the case where since the thickness of the resin mask is preferably small in order to form the vapor deposition pattern with high definition, the thickness of the resin mask is made small, durability and handling performance of the vapor deposition mask constituted of only the resin mask further deteriorate.

According to the vapor deposition mask of Embodiment (B), as mentioned above, even when the thickness of the resin mask 20 is made small, the presence of the metal mask 10 can give the vapor deposition mask 100 sufficient durability and handling ability.

Moreover, in the vapor deposition mask of Embodiment (B), the metal mask 10 having one through hole 15 is provided on the resin mask 20 having the plurality of openings 25, and all of the plurality of openings 25 are provided at the position of overlapping with the relevant one through hole 15. In the vapor deposition mask 100 of Embodiment (B) having this configuration, since metal portions do not exist between the openings 25, the vapor deposition pattern with high definition can be formed to match the dimensions of the openings 25 provided in the resin mask 20 without interference of metal portions suffered.

Figure 17:
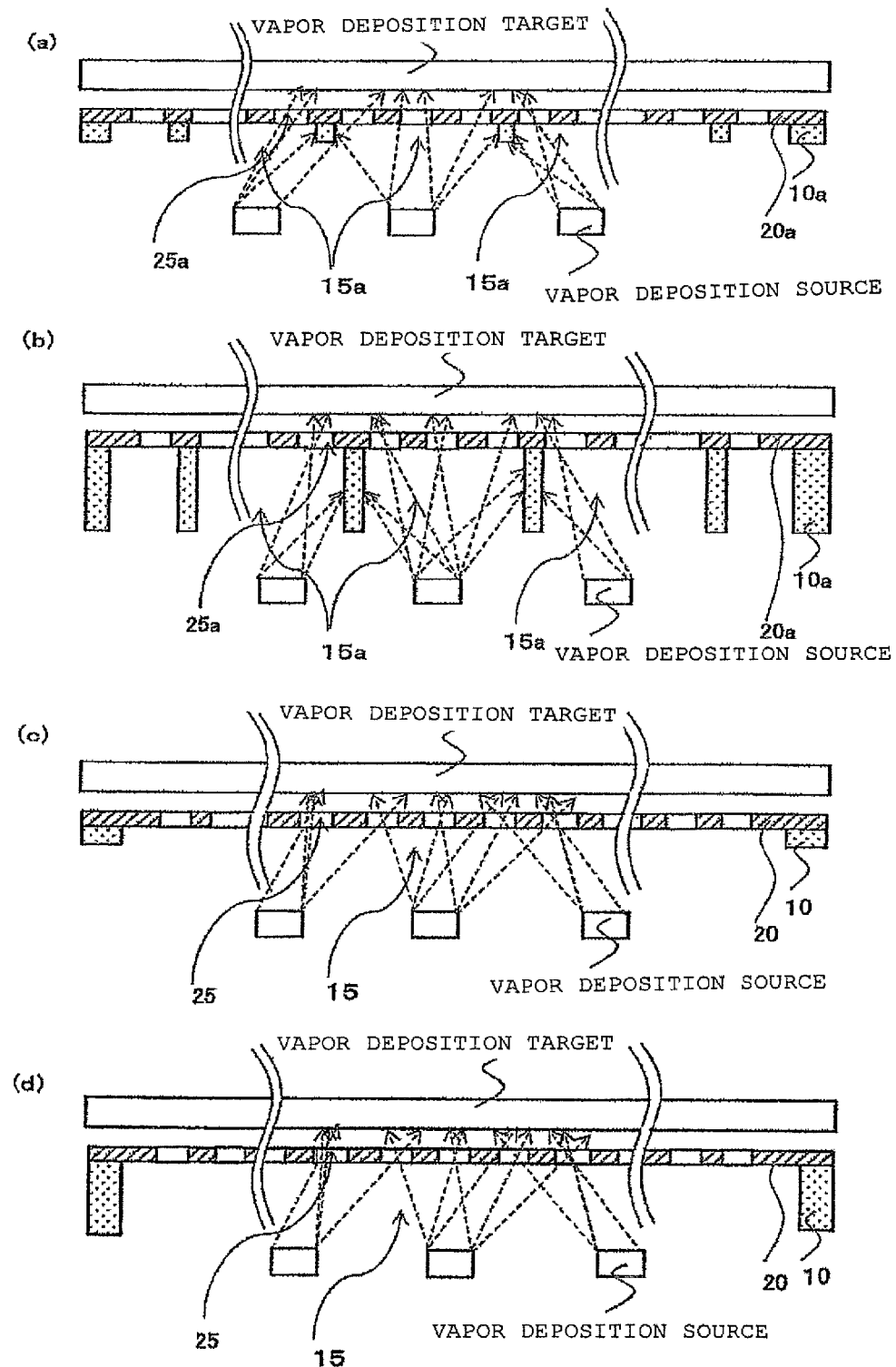
FIG. 17 is a schematic cross-sectional view showing relation between the shadow and the thickness of the metal mask.

Hereafter, with use of FIG. 17, an advantage of the vapor deposition mask of Embodiment (B) is specifically described. Notably, FIG. 17(a) is a partial expanded cross-sectional view of a vapor deposition mask in which openings 25a that a resin mask 20a has are divided by a plurality of through holes 15a, and metal portions constituting wall surfaces of the through holes 15a exist between the openings 25a. Moreover, FIG. 17(b) is a partial expanded cross-sectional view of a vapor deposition mask in which the thickness of a metal mask 10a is made thicker in FIG. 17(a).

As shown in FIGS. 17(a) and (b), in the case where the metal portion constituting the wall surface of the through hole 15a is caused to exist between the openings 25a, in forming the vapor deposition pattern with use of the vapor deposition mask shown in FIGS. 17(a) and (b), the vapor deposition material released from the vapor deposition source collides with the relevant metal portion, precision of the formed vapor deposition pattern decreases due to the influence of a shadow. Notably, the shadow is a phenomenon that a part of the vapor deposition material released from the vapor deposition source collides with the wall surface of the through hole of the metal mask and does not reach the vapor deposition target, and thereby, a portion without vapor deposition that has a film thickness smaller than the intended vapor deposition film thickness arises in the vapor deposition pattern. The collision of the vapor deposition material with the metal portion can arise more significantly as the thickness of the metal portion is larger, in other words, as the thickness of the metal mask 10a is larger.

In order to prevent generation of a shadow, as shown in FIG. 17(a), while the measure that the thickness of the metal mask 10a is made smaller is effective, in the case where the dimension of the openings 25a and the pitch between the openings 25a are made finer in order to form the vapor deposition pattern with high definition, even when the thickness of the metal mask 10a is made smaller to make the thickness of the metal portion existing between the openings 25a smaller, the influence of the shadow makes the formation of the vapor deposition pattern with high definition more difficult. Moreover, to make the thickness of the metal mask 10a small reduces durability of the entirety of the vapor deposition mask. Furthermore, in the case where the pitch between the openings 25a is made small, the metal portion existing between the relevant openings 25a is needed to be a fine wire, which increases the risk of breakage of the metal portion.

Meanwhile, in the vapor deposition mask 100 of Embodiment (B), as shown in FIGS. 17(c) and (d), since metal portions constituting wall surfaces of the through hole 15 do not exist between the openings 25, the vapor deposition pattern with high definition can be formed without the influence of a shadow suffered. In other words, since the metal portions constituting the wall surfaces of the through hole 15 are positioned near the end parts of the vapor deposition mask 100, they do not affect the formation of the vapor deposition pattern, and the vapor deposition pattern with high definition can be formed. Furthermore, as shown in FIG. 17(d), since there is almost no influence of a shadow even when the thickness of the metal mask 10 is made large, the thickness of the metal mask 10 can be made large until durability and handling ability can be sufficiently satisfied, which enables the formation of the vapor deposition pattern with high definition and can improve durability and handling ability.

(Resin Mask Constituting Vapor Deposition Mask of Embodiment (B))

The resin mask 20 constituting the vapor deposition mask of Embodiment (B) is composed of a resin, and as shown in FIG. 12, the plurality of openings 25 corresponding to the pattern to be produced by vapor deposition are provided at the position of overlapping with one through hole 15. The openings 25 correspond to the pattern to be produced by vapor deposition, and the vapor deposition pattern corresponding to the openings 25 is formed on the vapor deposition target by allowing the vapor deposition material released from the vapor deposition source to pass through the openings 25. In the shown mode, while the openings arranged in a plurality rows in the lengthwise direction and the crosswise direction are exemplarily described, they may be arranged only in the lengthwise direction or the crosswise direction. In the vapor deposition mask 100 of Embodiment (A), the slit 15 of the metal mask 10 is provided at the position of overlapping with at least one screen constituted of an aggregate of the openings provided in the resin mask. On the contrary, in the vapor deposition mask 100 of Embodiment (B), the through hole 15 of the metal mask 10 is positioned at the position of overlapping with all of the openings provided in the resin mask, which is the difference from the vapor deposition mask of Embodiment (A). For other than this difference, the aspects described in the above-mentioned vapor deposition mask of Embodiment (A) can be properly selected. Hereafter, the description is made mainly for the difference.

The shape and the dimension of the openings 25 are not specially limited, but they only have to be the shape and the dimension corresponding to the pattern to be produced by vapor deposition. Moreover, as shown in FIG. 11, the pitch P1 in the lengthwise direction and the pitch P2 in the crosswise direction between the neighboring openings 25 can be properly set depending on the pattern to be produced by vapor deposition. For example, in the case where the vapor deposition pattern with high definition of 400 ppi is formed, the pitch (P1) in the lengthwise direction and the pitch (P2) in the crosswise direction between the neighboring openings 25 out of the openings 25 composing one screen are approximately 60 µm. Moreover, the dimension of the openings is approximately 500 µm² to 1000 µm². Moreover, one opening 25 is not limited to correspond to one pixel, but, for example, a plurality of pixels can be collectively one opening 25 depending on a pixel arrangement.

Figure 15:
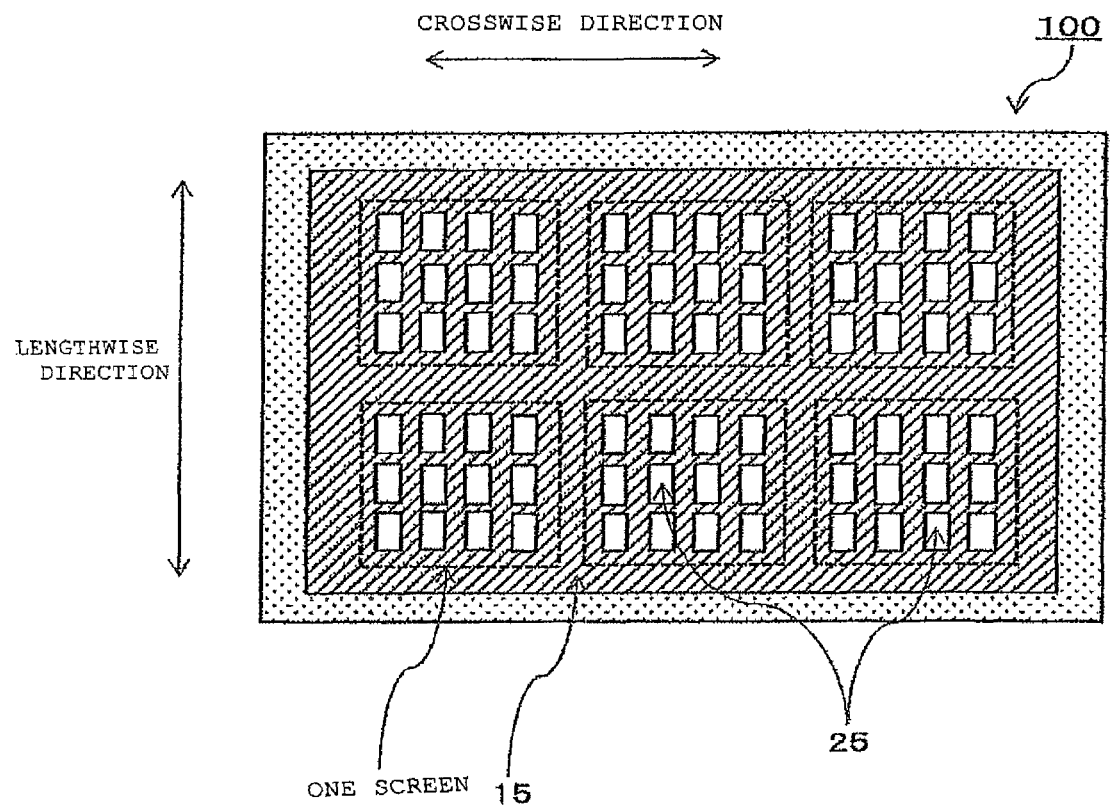
FIG. 15 is an elevation view of the vapor deposition mask of Embodiment (B) as seen from the metal mask side.

The vapor deposition mask 100 of Embodiment (B) may be used for formation of the vapor deposition pattern corresponding to one screen, or may be used for simultaneous formation of the vapor deposition patterns corresponding to two or more screens. In this case, as shown in FIG. 15, the openings 25 are preferably provided at a predetermined spacing on a screen-by-screen basis. Notably, in FIG. 15, a region closed by a broken line is "one screen". In FIG. 15, while twelve (12) openings 25 compose one screen, not limited to this mode, for example, millions of openings 25 can compose one screen, where one opening 25 is one pixel. As an example of the pitch between the screens, both of the pitch in lengthwise direction and the pitch in the crosswise direction are approximately 1 mm to 100 mm. Notably, the pitch between the screens means the pitch between the neighboring openings in one screen and another screen adjacent to the relevant one screen.

Figure 18:
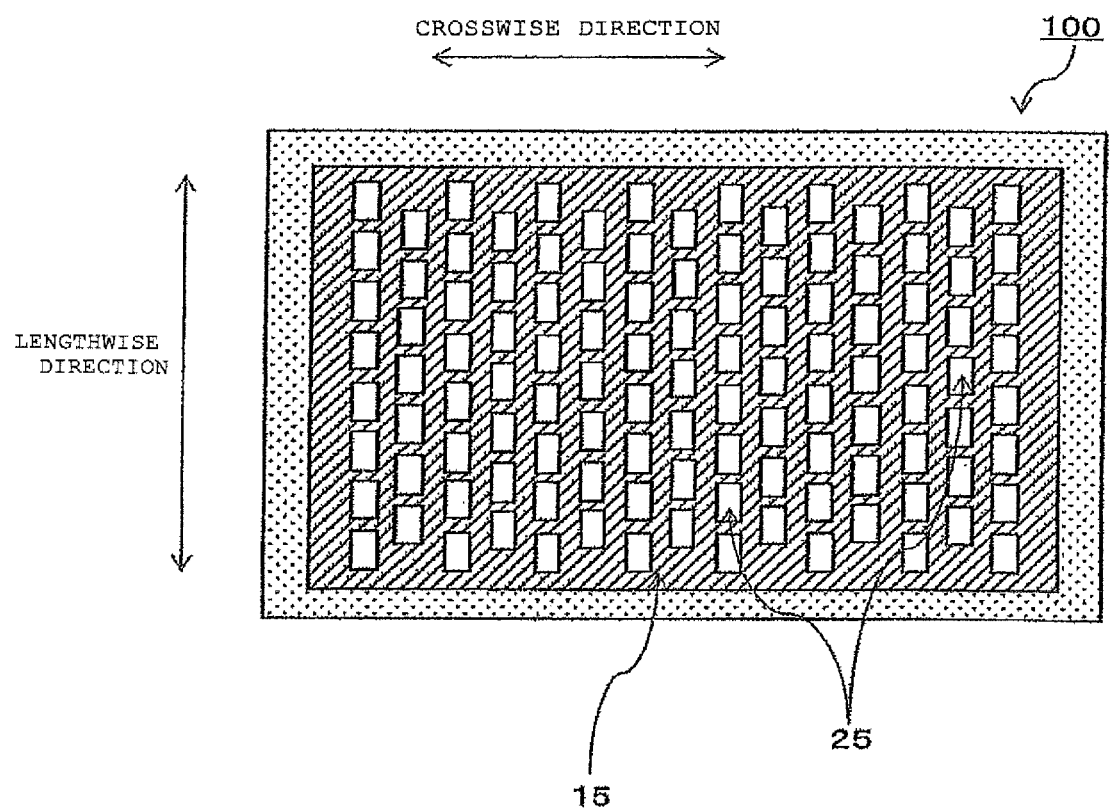
FIG. 18 is an elevation view of the vapor deposition mask of Embodiment (B) as seen from the metal mask side.

FIG. 18 is an elevation view showing another aspect of the vapor deposition mask 100 of Embodiment (B). As shown in FIG. 18, in an elevation view of the vapor deposition mask 100 as seen from the metal mask 10 side, the openings 25 may be alternately arranged in the crosswise direction. In other words, the openings 25 adjacent in the crosswise direction may be arranged to be displaced in the lengthwise direction. By the arrangement in this way, even when the resin mask 20 undergoes thermal expansion, the openings 25 can absorb expansions arising in portions, and large deformation can be prevented from arising due to accumulation of the expansions.

(Metal Mask Constituting Vapor Deposition Mask of Embodiment (B))

The metal mask 10 constituting the vapor deposition mask of Embodiment (B) is composed of metal and has one through hole 15. Further, in the vapor deposition mask of Embodiment (B), the relevant one through hole 15 is disposed at the position of overlapping with all of the openings 25, in other words, at the position where all of the openings 25 arranged in the resin mask 20 can be seen, as seen head-on of the metal mask 10.

Figure 13:
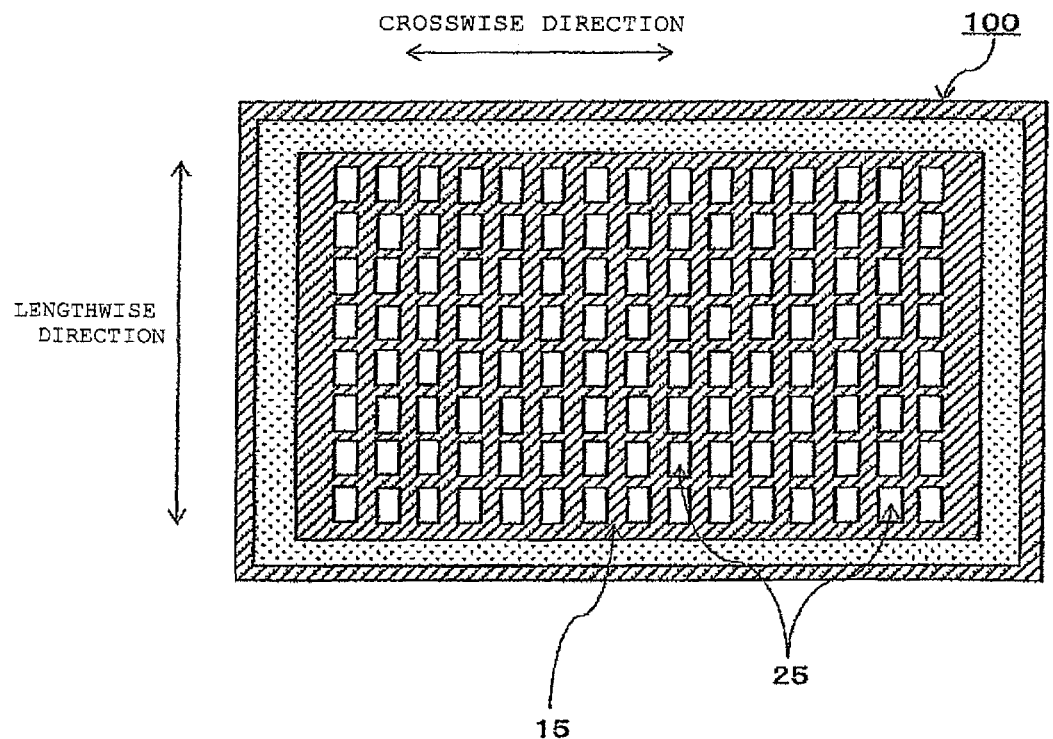
FIG. 13 is an elevation view of the vapor deposition mask of Embodiment (B) as seen from the metal mask side.
Figure 14:
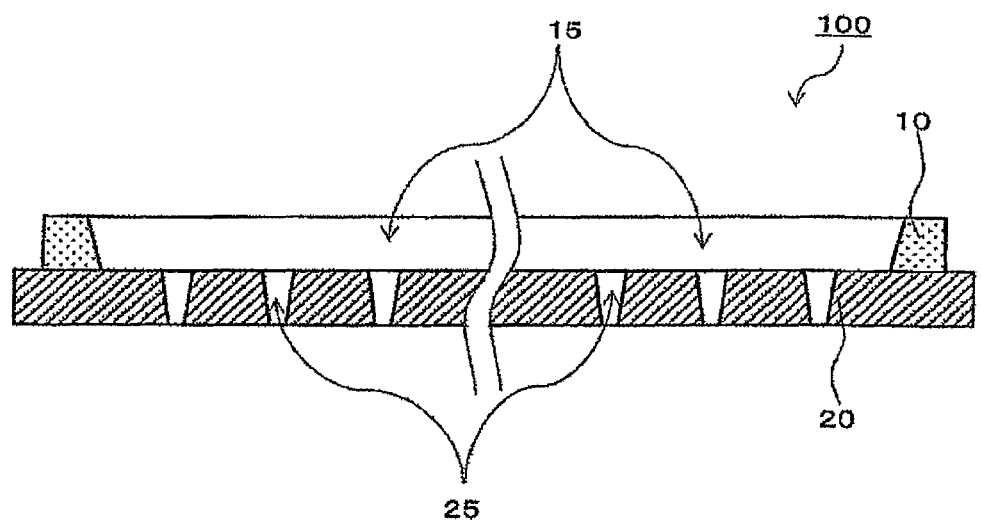
FIG. 14 is a partial expanded cross-sectional view of the vapor deposition mask shown in FIG. 13.

The metal portion composing the metal mask 10, that is, the portion thereof other than the through hole 15 may be provided along the outer edge of the vapor deposition mask 100 as shown in FIG. 11, or the dimension of the metal mask 10 may be made smaller than that of the resin mask 20 to expose an outer circumferential portion of the resin mask 20 as shown in FIG. 13. Notably, FIG. 14 is a partial expanded schematic cross-sectional view of the vapor deposition mask shown in FIG. 13. Moreover, the dimension of the metal mask 10 may be made larger than that of the resin mask 20, so that a part of the metal portion is caused to protrude outward in the crosswise direction of the resin mask or outward in the lengthwise direction thereof. Notably, in any case, the dimension of the through hole 15 is configured to be smaller than the dimension of the resin mask 20.

While a width (W1) in the crosswise direction and a width (W2) in the lengthwise direction of the metal portion constituting the wall surface of the through hole of the metal mask 10 shown in FIG. 11 are not specially limited, as the width W1, W2 is made smaller, durability and handling ability tend to deteriorate more. Accordingly, W1 and W2 are preferably widths by which durability and handling ability are sufficiently satisfied. While appropriate widths can be properly set depending on the thickness of the metal mask 10, as an example of preferable widths, both W1 and W2 are approximately 1 mm to 100 mm.

Moreover, in order to sufficiently prevent generation of a shadow in the opening 25 positioned near the inner wall surface of the through hole 15, the sectional shape of the through hole 15 is preferably a shape having broadening toward the vapor deposition source. By setting the sectional shape like this, even in the opening 25 positioned near the inner wall surface of the through hole 15, the vapor deposition material released from the vapor deposition source can be caused to pass through without waste. Specifically, the angle formed by the straight line connecting the lower bottom distal end in the through hold 15 of the metal mask 10 and the upper bottom distal end in the through hole 15 of the same metal mask 10 and the bottom surface of the metal mask 10 is preferably within a range of 25° to 65°. In particular, in this range, an angle that is smaller than the vapor deposition angle of the vapor deposition machine to be used is preferable.

As above, while the vapor deposition mask 100 of Embodiment (B) of the present invention is described mainly for the example where only one through hole 15 is provided in the metal mask 10, a plurality of through holes 15 may be provided in the metal mask 10. Notably, in this case, the essential condition is that one through hole 15 of the plurality of through holes 15 is provided at the position of overlapping with all of the openings 25 provided in the resin mask 20.

(Method for Producing Vapor Deposition Mask of Embodiment (A))

Figure 10:
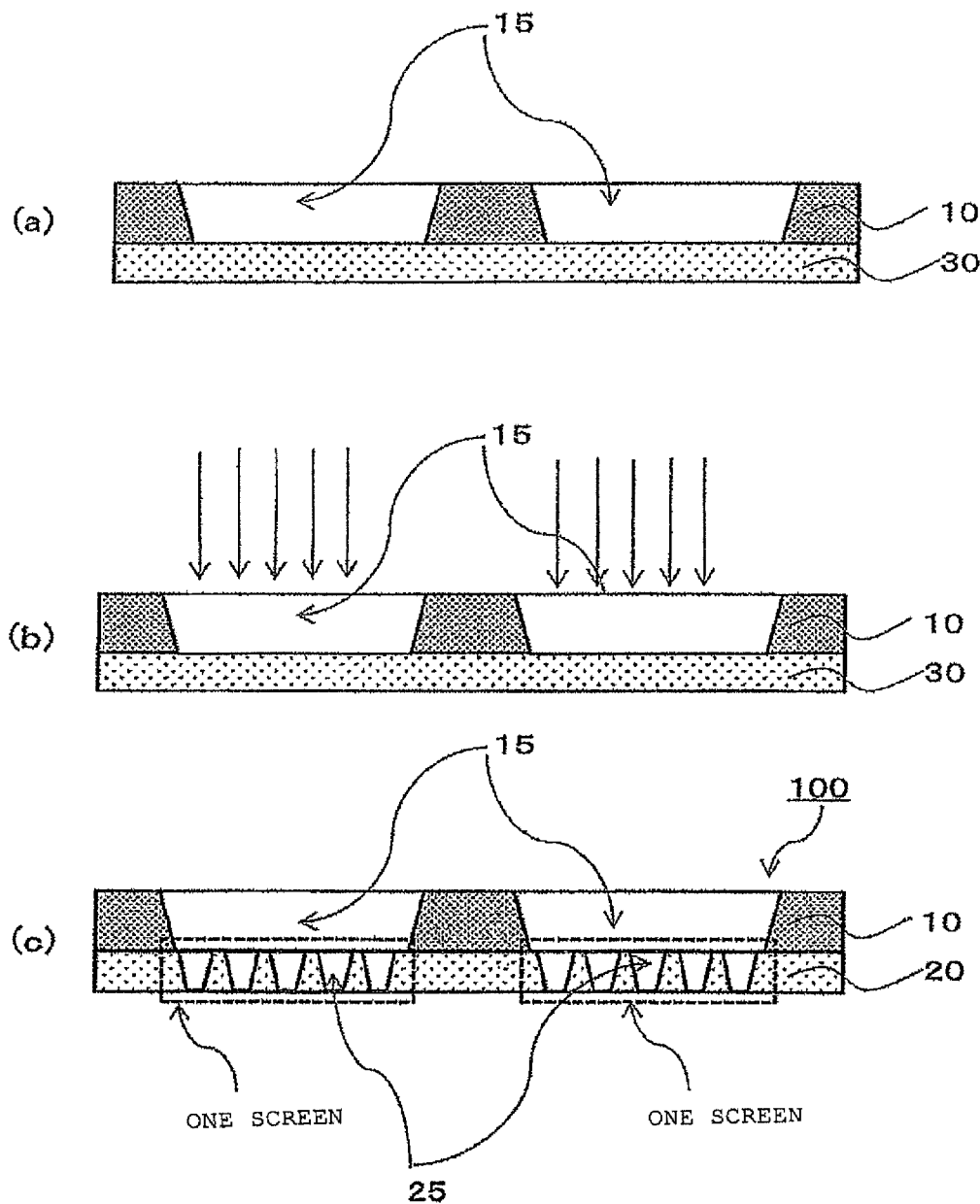
FIG. 10 is a step chart for exemplarily explaining a method for producing the vapor deposition mask of Embodiment (A). Notably, all of the portions (a) to (c) are cross-sectional views.

Next, a method for producing the vapor deposition mask of Embodiment (A) of the present invention is described. The method for producing the vapor deposition mask 100 of Embodiment (A) has a step of preparing a resin plate-equipped metal mask in which the metal mask 10 in which the plurality of slits 15 are provided and a resin plate 30 are stacked as shown in FIG. 10(a), and a resin mask forming step of forming the openings 25 required for composing the plurality of screens in the resin plate 30 by irradiation with laser from the metal mask side as shown in FIG. 10(b), wherein as the metal mask 10 composing the resin plate-equipped metal mask, a metal mask in which the slit 15 overlapping with the entirety of at least one screen out of the plurality of screens is provided is used. Hereafter, the method for producing the vapor deposition mask of Embodiment (A) is specifically described.

(Step of Preparing Resin Plate-Equipped Metal Mask)

When a resin plate-equipped metal mask in which the metal mask 10 in which the slits are provided and the resin plate 30 shown in FIG. 10(a) are stacked is prepared, first, the metal mask in which a plurality of slits 15 are provided is prepared. In the method for producing the vapor deposition mask of Embodiment (A), as the metal mask 10 prepared here, the metal mask 10 in which the slit 15 overlapping with the entirety of the openings 25 provided in the entirety of at least one screen described for the above-mentioned vapor deposition mask 100 of Embodiment (A) is provided is used.

A pasting method and a forming method of the metal mask and the resin plate to form the resin plate-equipped metal mask are not specially limited, for example, a stacked body beforehand formed by coating with a resin layer with respect to a metal plate which is to be the metal mask is prepared, the slits 15 are formed in the metal plate in the state of the stacked body, and thereby, the resin plate-equipped metal mask can also be obtained. In the method for producing the vapor deposition mask of Embodiment (A), the resin plate composing the resin plate-equipped metal mask also includes the resin layer formed by coating as above. In other words, the resin plate may be beforehand prepared, or may be formed by a conventionally known coating method or the like. Moreover, the metal mask 10 and the resin plate may be pasted together with use of various adhesive agents, or the resin plate having self-adhesion may be used. Notably, the dimensions of the metal mask 10 and the resin plate 30 may be the same as each other. With fixing to a frame which is arbitrarily performed after this taken into consideration, the dimension of the resin plate 30 is preferably made smaller than that of the metal plate 10 to set the state where the outer circumferential portion of the metal mask 10 is exposed, which facilitates welding of the metal mask 10 and the frame. The same holds true for the method for producing the vapor deposition mask of Embodiment (B), and the slits only have to be read as one through hole.

As the forming method of the metal mask 10 in which the slits 15 are provided, a masking member, for example, a resist material is applied onto the surface of the metal plate, predetermined portions are exposed and developed, and thereby, a resist pattern in which positions where the slits 15 are finally formed remain is formed. The resist material used as the masking member is preferably excellent in processing ability with desired resolution. Next, etching processing is performed by the etching method with use of the resist pattern as an etching resistant mask. After the completion of the etching, the resist pattern is cleaned and removed. By doing so, the metal mask 10 in which the plurality of slits 15 are provided is obtained. The etching for forming the slits 15 may be performed on one surface side of the metal plate, or may be performed on both surface sides thereof. Moreover, in the case where the slits 15 are formed in the metal plate with use of the stacked body in which the resin plate is provided on the metal plate, after the masking member is applied onto the surface of the metal plate on the side that is not in contact with the resin plate, the resist pattern is formed, and next, the slits 15 are formed by the etching from one surface side. Notably, in the case where the resin plate has etching resistance with respect to the etching agent of the metal plate, masking of the surface of the resin plate is not needed, but in the case where the resin plate does not have resistance with respect to the etching agent of the metal plate, the masking member is needed to be applied onto the surface of the resin plate. Moreover, in the above, while the resist material is mainly described as the masking member, in place of the application of the resist material, a dry film resist may be laminated to perform the similar patterning. The same holds true for the method for producing the vapor deposition mask of Embodiment (B), and the slits only have to be read as one through hole.

(Step of Fixing Resin Plate-Equipped Metal Mask to Frame)

While the relevant step is an arbitrary step in the method for producing the vapor deposition mask of Embodiment (A), since the completed vapor deposition mask is not fixed to the frame but the openings are provided later with respect to the resin plate-equipped metal mask in the state of being fixed to the frame, positional precision can be especially improved. Notably, in the case where the completed vapor deposition mask 100 is fixed to the frame, since the fixing is performed with the metal mask in which the openings are determined pulled with respect to the frame, precision in opening position coordinate is to decrease as compared with the case of having the present step.

A method of fixing the resin plate-equipped metal mask to the frame is not specially limited, but, for example, a conventionally known step method such as spot welding only has to be properly adopted.

(Step of Forming Openings Corresponding to Pattern to be Produced by Vapor Deposition in Resin Plate of Resin Plate-Equipped Metal Mask by Irradiation with Laser from Metal Mask Side)

Next, as shown in FIG. 10(b), the openings 25 corresponding to the pattern to be produced by vapor deposition are formed in the resin plate 30 by irradiation with laser from the metal mask 10 side of the resin plate-equipped metal mask through the slit 15, to form the resin mask 20. The laser apparatus used here is not specially limited, but a conventionally known laser apparatus only has to be used. By doing so, the vapor deposition mask 100 of Embodiment (A) as shown in FIG. 10(c) is obtained.

Notably, in the production method of Embodiment (A), since the metal mask 10 in which the slit 15 is beforehand provided at the position of overlapping with the entirety of one screen or the entirety of two or more screens is used, in the present step, the openings 25 required for composing one screen or the openings 25 required for composing two or more screens are formed in one slit 15. In other words, one slit 15 is provided so as to overlap with the openings composing the entirety of one screen or the openings 25 composing the entirety of two or more screens.

Moreover, when the openings 25 are provided in the resin plate of the resin plate-equipped metal mask fixed to the frame, a reference sheet (not-shown) in which the pattern to be produced by vapor deposition, that is, the pattern corresponding to the openings 25 to be formed are beforehand provided may be prepared, and laser irradiation corresponding to the pattern of the reference sheet may be performed from the metal mask 10 side in the state where the reference sheet is pasted on the surface of the resin plate on the side that the metal mask 10 is not provided on. According to this method, the openings 25 can be formed by the laser irradiation performed, watching the pattern of the reference sheet pasted on the resin plate-equipped metal mask, in the state of so-called face-to-face. Thereby, the openings 25 with high definition in which dimensional precision of the openings is extremely high can be formed. Moreover, since in this method, the openings 25 are formed in the state of being fixed to the frame, the vapor deposition mask is enabled to be excellent not only in dimensional precision but also in positional precision.

Notably, in the case of using the above-mentioned method, the pattern of the reference sheet is needed to be able to be recognized by the laser irradiation apparatus or the like from the metal mask 10 side via the resin plate 30. While the resin plate needs to have transparency in the case of having a thickness to some extent, in the case of the thickness preferable with the influence of a shadow taken into consideration, for example, in the case of the thickness of approximately 3 µm to 25 µm as described above, even a colored resin plate can be caused to recognize the pattern of the reference sheet. The similar method can also be used for the method for producing the vapor deposition mask of Embodiment (B).

A method for pasting the resin plate-equipped metal mask and the reference sheet together is not specially limited, but, for example, in the case where the metal mask 10 is a magnetic body, a magnet or the like is disposed at a rear side of the reference sheet, and the resin plate 30 of the resin plate-equipped metal mask and the reference sheet are pasted together by being attracted. Besides this, the pasting can be performed with use of the electrostatic adsorbing method or the like. As the reference sheet, for example, a TFT substrate having a predetermined opening pattern, a photo mask and the like can be cited. The similar method can also be used for the method for producing the vapor deposition mask of Embodiment (B).

Moreover, a slimming step may be performed between the steps described above, or after the steps. For example, in the case where the resin plate 30 finally to be the resin mask 20 or the metal mask 10 having a thickness larger than that described above is used, excellent durability and transportability can be given in the case where the metal mask 10 or the resin plate 30 are solely transported during the production steps or the similar case. Meanwhile, in order to prevent generation of a shadow or the like, the thickness of the vapor deposition mask 100 obtained by the production method of Embodiment (A) is preferably the optimum thickness. The slimming step is a useful step in the case of optimizing the thickness of the vapor deposition mask 100 while satisfying durability and transportability during the production steps or after the steps.

The slimming of the metal mask 10 can be realized by etching the surface of the metal mask 10 on the side that is not in contact with the resin plate 30 or the surface of the metal mask 10 on the side that is not in contact with the resin plate 30 or the resin mask 20 with use of the etching agent capable of etching the metal mask 10 between the steps described above, or after the steps.

The slimming of the resin plate 30 to be the resin mask 20 and the resin mask 20, that is, optimization of the thickness of the resin plate 30 and the resin mask 20 is similar to the above, and can be realized by etching the surface of the resin plate 30 on the side that is not in contact with the metal mask 10 or the surface of the resin mask 20 on the side that is not in contact with the metal mask 10 with use of the etching agent capable of etching the materials of the resin plate 30 and the resin mask 20 between any of the steps described above, or after the steps. Moreover, after the vapor deposition mask 100 is formed, both the metal mask 10 and the resin mask 30 undergo the etching processing, and thereby, the thicknesses of both of them can also be optimized. The above-mentioned slimming step can also be applied to the method for producing the vapor deposition mask of Embodiment (B) as it is.

(Method for Producing Vapor Deposition Mask of Embodiment (B))

Figure 19:
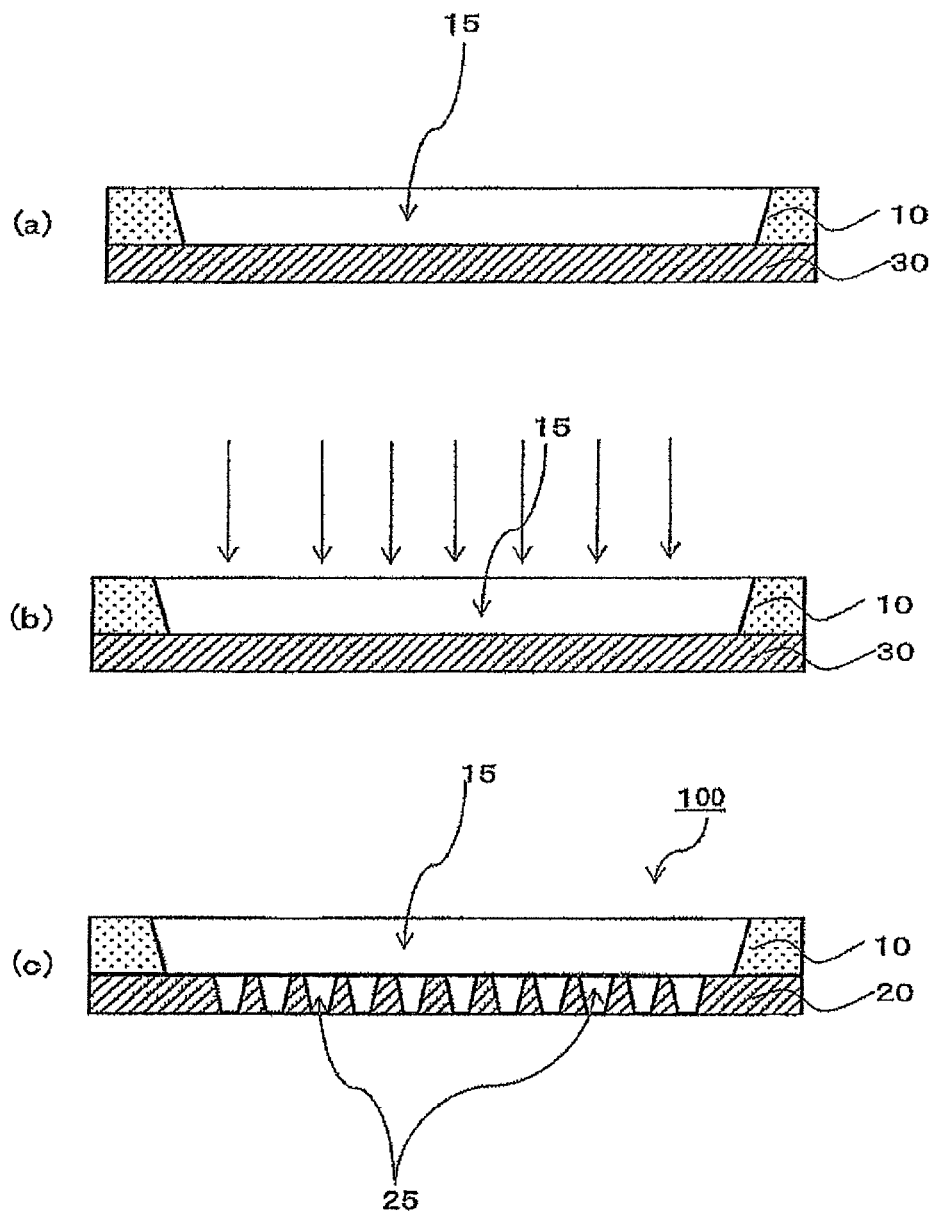
FIG. 19 is a step chart for exemplarily explaining a method for producing the vapor deposition mask of Embodiment (B). Notably, portions (a) to (c) are cross-sectional views.

Next, a method for producing the vapor deposition mask of Embodiment (B) of the present invention is described. As shown in FIG. 19, the method for producing the vapor deposition mask 100 of Embodiment (B) includes a step of preparing a resin plate-equipped metal mask in which the metal mask 10 in which one through hole is provided and the resin plate 30 are stacked (refer to FIG. 19(*a*)), and a resin mask forming step of forming the plurality of openings 25 at the position of overlapping with one through hole 15 in the resin plate 30 by irradiation with laser from the metal mask 10 side (refer to FIG. 19(*b*)). Hereafter, the method for producing the vapor deposition mask of Embodiment (B) is specifically described.

(Step of Preparing Resin Plate-Equipped Metal Mask)

The present step is a step of preparing the resin plate-equipped metal mask in which the metal mask 10 and the resin plate 30 are stacked by pasting the metal mask 10 in which one through hole 15 is provided and the resin plate 30 together.

(Step of Fixing Resin Plate-Equipped Metal Mask to Frame)

The relevant step is an arbitrary step in the method for producing the vapor deposition mask of Embodiment (B), the method described for the above-mentioned method for producing the vapor deposition mask of Embodiment (A) can be used as it is, and the detailed description here is omitted.

(Step of Forming Plurality of Openings Overlapping with One Through Hole in Resin Plate-Equipped Metal Mask by Irradiation with Laser from Metal Mask Side)

Next, as shown in FIG. 19(*b*), the openings 25 corresponding to the pattern to be produced by vapor deposition are formed in the resin plate 30 by irradiation with laser from the metal mask 10 side through one through hole 15, to form the resin mask 20. In this step, since the irradiation with laser is performed through one through hole 15, the plurality of openings 25 are to be finally formed at the position of overlapping with one through hole 15. The laser apparatus used here is not specially limited, but a conventionally known laser apparatus only has to be used. By doing so, the vapor deposition mask 100 of Embodiment (B) as shown in FIG. 19(*c*) is obtained.

(Vapor Deposition Mask Preparation Body)

Next, a vapor deposition mask preparation body of an embodiment of the present invention is described. The vapor deposition mask preparation body of an embodiment of the present invention is a vapor deposition mask preparation body for obtaining a vapor deposition mask including: a metal mask in which a plurality of slits are provided; and a resin mask, the metal mask and the resin mask being stacked, openings required for composing a plurality of screens provided in the resin mask, the openings corresponding to a pattern to be produced by vapor deposition, each of the slits provided at a position of overlapping with an entirety of at least one screen. The metal mask in which the slits are provided is stacked on one surface of a resin plate, and each of the slits is provided at a position of overlapping with an entirety of the openings which compose one screen and are finally provided in the resin plate.

The vapor deposition mask preparation body of an embodiment of the present invention is common to the above-described vapor deposition mask 100 of Embodiment (A) except in that the openings 25 are not provided in the resin plate, and its specific description is omitted. As a specific configuration of the vapor deposition mask preparation body of an embodiment, the resin plate-equipped metal mask prepared in the preparing step in the above-mentioned method for producing the vapor deposition mask of Embodiment (A) (refer to FIG. 10(*a*)) can be cited.

According to the above-mentioned vapor deposition mask preparation body of an embodiment, by forming the openings in the resin plate of the relevant vapor deposition mask preparation body, the vapor deposition mask capable of satisfying both high definition and lightweight in upsizing and forming a vapor deposition pattern with high definition can be obtained.

A vapor deposition mask preparation body of another embodiment is a vapor deposition mask preparation body for obtaining a vapor deposition mask including: a metal mask in which one through hole is provided; and a resin mask in which a plurality of openings corresponding to a pattern to be produced by vapor deposition are provided, the metal mask and the resin mask being stacked, all of the plurality of openings provided at a position of overlapping with the one through hole. The metal mask in which the one through hole is provided is stacked on one surface of the resin plate. The one through hole is provided at a position of overlapping with all of the openings which are finally provided in the resin plate.

The vapor deposition mask preparation body of another embodiment is common to the above-described vapor deposition mask 100 of Embodiment (B) except in that the openings 25 are not provided in the resin plate, and its specific description is omitted. As a specific configuration of the vapor deposition mask preparation body of another embodiment, the resin plate-equipped metal mask prepared in the preparing step in the above-mentioned method for producing the vapor deposition mask of Embodiment (B) (refer to FIG. 19(*a*)) can be cited.

According to the above-mentioned vapor deposition mask preparation body of another embodiment, by forming the openings in the resin plate of the relevant vapor deposition mask preparation body, the vapor deposition mask capable of satisfying both high definition and lightweight in upsizing and forming a vapor deposition pattern with high definition can be obtained.

(Method for Producing Organic Semiconductor Element)

Next, a method for producing an organic semiconductor element of an embodiment of the present invention is described. The method for producing an organic semiconductor element of an embodiment of the present invention has a step of forming a vapor deposition pattern in a vapor deposition method with use of a frame-equipped vapor deposition mask, and is the frame-equipped vapor deposition mask below is used in the relevant step of forming an organic semiconductor element.

The method for producing an organic semiconductor element of an embodiment having the step of forming the vapor deposition pattern in the vapor deposition method with use of the frame-equipped vapor deposition mask has an electrode forming step of forming an electrode on a substrate, an organic layer forming step, a counter electrode forming step, a sealing layer forming step, and the like, and in each of the arbitrary steps, the vapor deposition pattern is formed on the substrate in the vapor deposition method with use of the frame-equipped vapor deposition mask. For example, in the case where the vapor deposition method using the frame-equipped vapor deposition mask is applied to each of light-emitting layer forming steps for colors of R, G and B of an organic EL device, the vapor deposition patterns of light-emitting layers for the respective colors are formed on the substrate. Notably, the method for producing an organic semiconductor element of an embodiment of the present invention is not limited to these steps, but can be applied to an arbitrary step in producing a conventionally known organic semiconductor element with use of a vapor deposition method.

In the method for producing an organic semiconductor element of an embodiment of the present invention, in the above-mentioned step of forming the vapor deposition pattern, the vapor deposition mask fixed to the frame is the vapor deposition mask of Embodiment (A) or the vapor deposition mask of Embodiment (B) described above.

For the vapor deposition mask composing the frame-equipped vapor deposition mask, the vapor deposition mask 100 of Embodiment (A) or Embodiment (B) described above can be used as it is, and its detailed description is omitted. According to the method for producing an organic semiconductor element with use of the frame-equipped vapor deposition mask including the vapor deposition mask of Embodiment (A) or the vapor deposition mask of Embodiment (B) of the present invention described above, an organic semiconductor element having a pattern with high definition can be formed. As the organic semiconductor element produced in the method for producing an organic semiconductor element of an embodiment of the present invention, for example, organic layers, light-emitting layers, cathode electrodes and the like of an organic EL element can be cited. In particular, the method for producing an organic semiconductor element of an embodiment of the present invention can be preferably used for producing light-emitting layers of R, G and B of an organic EL element for which high definition pattern precision is required.

Figure 20:
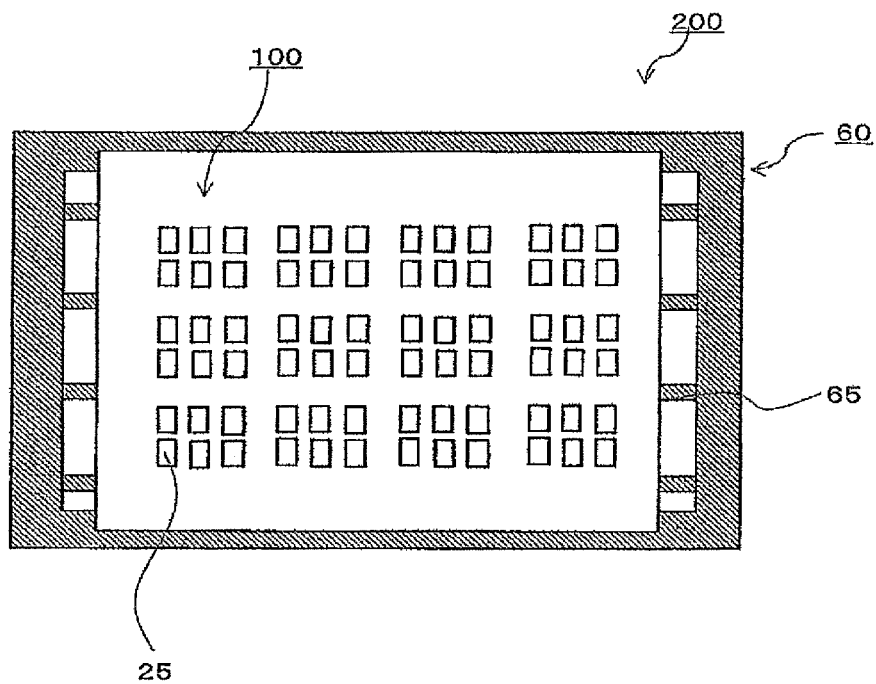
FIG. 20 is an elevation view of a frame-equipped vapor deposition mask of an embodiment as seen from the resin mask side.
Figure 21:
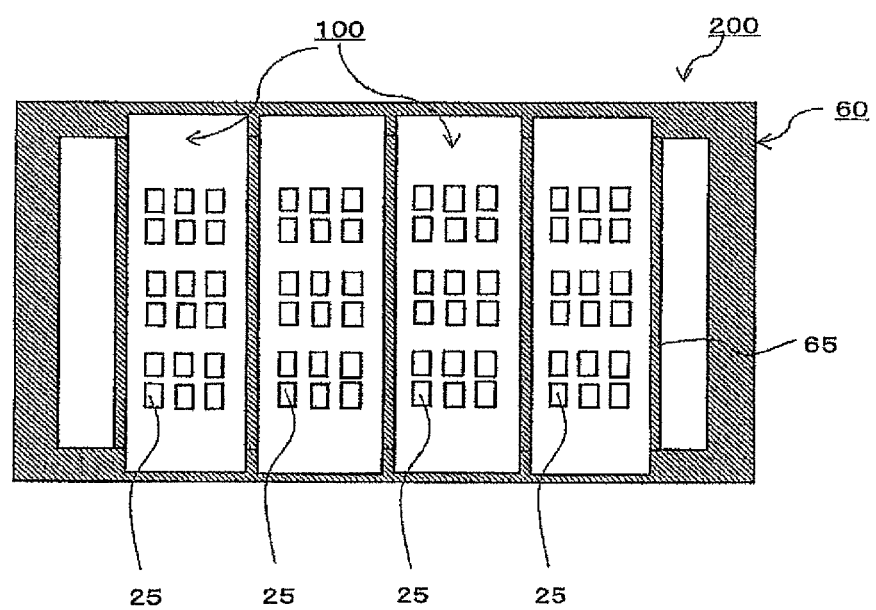
FIG. 21 is an elevation view of a frame-equipped vapor deposition mask of an embodiment as seen from the resin mask side.

The frame-equipped vapor deposition mask used for producing the organic semiconductor element only has to satisfy the condition that the vapor deposition mask of Embodiment (A) or Embodiment (B) described above is fixed to the frame, and is not specially limited in other conditions. The frame is not specially limited, but may be a member that can support the vapor deposition mask, and, for example, a metal frame, a ceramic frame or the like can be used. Above all, the metal frame is preferable since it is easily welded to the metal mask of the vapor deposition mask, and influence such as deformation is small. Hereafter, an example in which a metal frame is used as the frame is mainly described. For example, as shown in FIG. 20, a metal frame-equipped vapor deposition mask 200 in which one vapor deposition mask 100 is fixed to a metal frame 60 may be used, or as shown in FIG. 21, a metal frame-equipped vapor deposition mask 200 in which a plurality of vapor deposition masks (four vapor deposition masks in the shown mode) are fixed to a metal frame 60 to line up in the lengthwise direction or the crosswise direction (fixed to line up in the crosswise direction in the shown mode) may be used. Notably, each of FIG. 20 and FIG. 21 is an elevation view of the metal frame-equipped vapor deposition mask 200 of an embodiment as seen from the resin mask 20 side.

The metal frame 60 is a frame member in a substantially rectangular shape, and has an opening for exposing the openings 25 provided in the resin mask 20 of the vapor deposition mask 100 which is finally fixed, to the vapor deposition source side. The material of the metal frame is not specially limited, but a metal material large in rigidity such, for example, as SUS and an invar material is preferable.

The thickness of the metal frame is not specially limited, but is preferably approximately 10 mm to 30 mm in view of rigidity and the like. The width between the inner circumferential end face of the opening of the metal frame and the outer circumferential end face of the metal frame is not specially limited as long as it is a width with which the relevant metal frame can be fixed to the metal mask of the vapor deposition mask, but, for example, can be exemplarily a width of approximately 10 mm to 50 mm.

Moreover, a reinforcement frame 65 or the like may exist in the opening of the metal frame within a range where the exposure of the openings 25 of the resin mask 20 composing the vapor deposition mask 100 is not prevented. In other words, the opening included in the metal frame 60 may have a configuration in which it is divided by a reinforcement frame or the like. In the mode shown in FIG. 20, while a plurality of reinforcement frames 65 extending in the crosswise direction are arranged in the lengthwise direction, in place of these reinforcement frames 65 or along with these, a plurality of rows of reinforcement frames extending in the lengthwise direction may be arranged in the crosswise direction. Moreover, in the mode shown in FIG. 21, while a plurality of reinforcement frames 65 extending in the lengthwise direction are arranged in the crosswise direction, in place of these reinforcement frames 65 or along with these, a plurality of reinforcement frames extending in the crosswise direction may be arranged in the lengthwise direction. By using the metal frame 60 in which the reinforcement frames 65 are arranged, when the plurality of vapor deposition masks 100 of Embodiment (A) or Embodiment (B) described above are fixed to the metal frame 60 to line up in the lengthwise direction and the crosswise direction, the vapor deposition masks can be fixed to the metal frame 60 even when the vapor deposition masks are placed at positions of overlapping with the reinforcement frames.

A method of fixing the metal frame 60 to the vapor deposition mask 100 of Embodiment (A) or Embodiment (B) described above is not specially limited, but the fixing can be performed by using spot welding of fixing with laser light or the like, an adhesive, screw fixing or the like.

REFERENCE SIGNS LIST

100 Vapor deposition mask
10 Metal mask
15 Slit, through hole
20 Resin mask
25 Opening
28 Groove
60 Metal frame
200 Frame-equipped vapor deposition mask

The invention claimed is:
1. A vapor deposition mask comprising:
a resin mask and a metal mask stacked on one another;
the resin mask having a plurality of groups of openings, with each group of the plurality of groups of openings being configured to form at least a vapor deposition pattern;
the metal mask having a plurality of through holes corresponding in number to the plurality of groups of openings;
each through hole of the plurality of through holes entirely overlapping each respective group of openings of the plurality of groups of openings.

2. The vapor deposition mask according to claim 1, wherein the plurality of groups of openings are openings configured to form vapor deposition patterns corresponding to two or more screens.

3. The vapor deposition mask according to claim 2, wherein a pitch between the screens is the minimum value among distances, each distance being between an opening of the plurality of groups of openings belonging to a vapor deposition pattern corresponding to one screen and an opening of the plurality of groups of openings belonging to another vapor deposition pattern corresponding to another screen, and the pitch between the screens is longer than a spacing between adjacent openings of the plurality of groups of openings belonging to a same vapor deposition pattern.

4. The vapor deposition mask according to claim 3, wherein the pitch between the screens is not less than 1 mm and not more than 100 mm.

5. The vapor deposition mask according to claim 2, wherein a groove is further provided on the resin mask between a set of openings of the plurality of groups of openings corresponding to one screen and another set of openings of the plurality of groups of openings corresponding to another screen.

6. The vapor deposition mask according to claim 1, wherein a thickness of the resin mask is not less than 4 μm and not more than 8 μm.

7. The vapor deposition mask according to claim 1, wherein a dimension of each opening is not less than 500 μm$^2$ and not more than 1000 μm$^2$.

8. The vapor deposition mask according to claim 1, wherein the plurality of groups of openings overlapped with the plurality of through holes are arranged to be in alignment in both of a crosswise direction and a lengthwise direction.

9. The vapor deposition mask according to claim 1, wherein the plurality of openings overlapped with the through hole are arranged to be in alignment in either of a crosswise direction or a lengthwise direction.

10. The vapor deposition mask according to claim 1, wherein the plurality of groups of openings overlapped with the plurality of through holes are arranged to form a plurality of rows in the lengthwise direction, and openings of the plurality of groups of openings adjacent in the crosswise direction are arranged to be displaced in the lengthwise direction; or
the plurality of groups of openings overlapped with the plurality of through holes are arranged to form a plurality of rows in the crosswise direction, and openings of the plurality of groups of openings adjacent in the lengthwise direction are arranged to be displaced in the crosswise direction.

11. A vapor deposition mask comprising:
a resin mask and a metal mask stacked on one another;
the resin mask having a plurality of groups of second openings, with each group of the plurality of groups of second openings configured to form at least a vapor deposition pattern;
the metal mask having a plurality of first openings corresponding in number to the plurality of groups of second openings, wherein each first opening of the plurality of first openings entirely overlaps each respective group of second openings of the plurality of groups of second openings.

12. The vapor deposition mask according to claim 11, wherein the plurality of groups of second openings are openings configured to form vapor deposition patterns corresponding to two or more screens.

13. The vapor deposition mask according to claim 12, wherein a pitch between the screens is the minimum value among distances, each distance being between a second opening of the plurality of groups of second openings belonging to a vapor deposition pattern corresponding to one screen and a second opening of the plurality of groups of second openings belonging to another vapor deposition pattern corresponding to another screen, and the pitch between the screens is longer than a spacing between adjacent second openings of the plurality of groups of second openings belonging to a same vapor deposition pattern.

14. The vapor deposition mask according to claim 13, wherein the pitch between the screens is not less than 1 mm and not more than 100 mm.

15. The vapor deposition mask according to claim 12, wherein a groove is further provided on the resin mask between a set of second openings of the plurality of groups of second openings corresponding to one screen and another set of second openings of the plurality of groups of second openings corresponding to another screen.

16. The vapor deposition mask according to claim 11, wherein a thickness of the resin mask is not less than 4 μm and not more than 8 μm.

17. The vapor deposition mask according to claim 11, wherein a dimension of each second opening is not less than 500 μm$^2$ and not more than 1000 μm$^2$.

18. The vapor deposition mask according to claim 11, wherein the plurality of groups of second openings overlapped with the plurality of first openings are arranged to be in alignment in both of a crosswise direction and a lengthwise direction.

19. The vapor deposition mask according to claim 11, wherein the plurality of second openings overlapped with the first opening are arranged to be in alignment in either of a crosswise direction or a lengthwise direction.

20. The vapor deposition mask according to claim 11, wherein the plurality of groups of second openings overlapped with the plurality of first openings are arranged to form a plurality of rows in the lengthwise direction, and second openings of the plurality of groups of second openings adjacent in the crosswise direction are arranged to be displaced in the lengthwise direction; or the plurality of groups of second openings overlapped with the plurality of first openings are arranged to form a plurality of rows in the crosswise direction, and second openings of the plurality of groups of second openings adjacent in the lengthwise direction are arranged to be displaced in the crosswise direction.

21. A method of producing a vapor deposition pattern using the vapor deposition mask of claim 1.

22. A method of producing a vapor deposition pattern using the vapor deposition mask of claim 11.

23. A method of producing an organic semiconductor element using the vapor deposition mask of claim 1.

24. A method of producing an organic semiconductor element using the vapor deposition mask of claim 11.

* * * * *